United States Patent [19]

Goto

[11] Patent Number: 5,706,477
[45] Date of Patent: Jan. 6, 1998

[54] CIRCUIT SIMULATION MODEL EXTRACTING METHOD AND DEVICE

[75] Inventor: Kazunari Goto, Yokohama, Japan

[73] Assignee: Fujitsu Limited, Kawasaki, Japan

[21] Appl. No.: 555,710

[22] Filed: Nov. 14, 1995

[30] Foreign Application Priority Data

Nov. 5, 1994 [JP] Japan ............................. 6-280774
Oct. 23, 1995 [JP] Japan ............................. 7-027440

[51] Int. Cl.$^6$ ............................. G06F 9/455; G06F 17/50
[52] U.S. Cl. ........................ 395/500; 364/488; 364/490; 364/491; 364/578; 364/DIG. 1; 364/221.2; 364/DIG. 2; 364/916.3; 364/971.96
[58] Field of Search ............................. 395/500; 364/488, 364/489, 490, 491, 578, 602, 200 MS File, 900 MS File

[56] References Cited

U.S. PATENT DOCUMENTS

| | | | |
|---|---|---|---|
| 4,792,913 | 12/1988 | Buckland et al. | 364/602 |
| 5,084,824 | 1/1992 | Lam et al. | 364/490 |
| 5,210,699 | 5/1993 | Harrington | 364/488 |
| 5,404,310 | 4/1995 | Mitsuhashi | 364/490 |
| 5,426,770 | 6/1995 | Nuber | 395/500 |
| 5,463,563 | 10/1995 | Bair et al. | 364/490 |
| 5,471,398 | 11/1995 | Stephens | 364/490 |
| 5,481,695 | 1/1996 | Purks | 395/500 |
| 5,537,580 | 7/1996 | Giomi et al. | 395/500 |
| 5,544,067 | 8/1996 | Rostoker et al. | 364/489 |
| 5,572,437 | 11/1996 | Rostoker et al. | 364/489 |
| 5,598,344 | 1/1997 | Dangelo et al. | 364/489 |

OTHER PUBLICATIONS

"Modeling Power Semiconductor Devices for Realistic Simulation", by Allen Heffner, IEEE, Computers in Power Electronics, 1994 Workshop, pp. 11–44.

*Primary Examiner*—Kevin J. Teska
*Assistant Examiner*—Russell W. Frejd
*Attorney, Agent, or Firm*—Staas & Halsey

[57] ABSTRACT

A memory unit stores logic information expressing a plurality of logic function elements constituting a logic circuit, and wiring information about a plurality of components that correspond to the plurality of logic function elements on a printed circuit board. An extracting unit extracts the wiring information and logic information to be used for executing circuit simulation from among the wiring information and logic information stored in the memory unit. A circuit model conversion unit converts the wiring information and logic information extracted by the extracting unit into a circuit model suitable for executing the circuit simulation. A simulation unit executes the circuit simulation on the basis of the circuit model converted by the circuit model conversion unit, and identifies the electrical characteristics between the plurality of components that correspond to the wiring information and logic information extracted by the extracting unit.

43 Claims, 30 Drawing Sheets

| LAYER | RESISTANCE R (Ω/cm) | INDUCTANCE L (nH/cm) | CAPACITANCE C (fF/cm) |
|---|---|---|---|
| M1 | 2 | 5 | 100 |
| M2 | 8 | 7 | 80 |
| M3 | 8 | 4 | 500 |

CIRCUIT SIMULATION MODEL EXTRACTING METHOD AND DEVICE

BACKGROUND OF THE INVENTION

1. Field of the Invention

The present invention relates to a circuit simulation model extracting method and device, and more particularly to a circuit simulation model extracting method and device for printed circuit boards designed by computer-aided design (hereinafter "CAD").

2. Description of the Related Art

Conventionally, when a board design device is used to design a printed circuit board by CAD, logic circuits are designed, and the packaging of components that correspond to the logic circuits is designed. For example, as a logic design, the board design device first prepares a logic circuit drawing by performing logic circuit input processing based on the logic information that expresses logic function elements stored in a data base.

Subsequently, as a packaging design, the board design device determines the shape of the printed circuit board and performs each component to allocation processing using physical information about the components stored in the data base. The board design device also prepares a component layout drawing by performing each component to layout processing using the physical information about the components and the information about the shape of the printed circuit board.

The board design device further prepares a wiring pattern drawing by performing wiring pattern preparation processing using the physical information about the components and the information about the shape of the printed circuit board. The board design device then analyzes the signal delay time and noise and determines whether or not the printed circuit board is normal.

Recently, however, with improvements in the performance of data processing computers (hereinafter "computers") and increases in scale to large-scale-integration (LSI) circuits, computers mounted printed circuit boards began performing high-speed processing. For this reason, signal timing errors, weak noise, or the like resulting from the wiring at the printed circuit board level became an impediment to high-speed processing. It was therefore necessary to correctly identify electrical information (shape of transmitted waveforms, AC noise data, and delay time information) from the wiring conditions.

To obtain the electrical information, circuit simulation is performed before a computer is manufactured. In this case, manufacturers prepared a circuit model correctly expressing the actual wiring conditions in order to perform this circuit simulation. For this reason, considerable time was needed to prepare a circuit model. In addition, the quality of the printed circuit board decreases because mistakes and the like are apt to occur during the preparation of a circuit model.

Furthermore, there was a limit to the manual preparation of circuit models because the volume of information increases due to the increases in the wiring density.

SUMMARY OF THE INVENTION

An object of the present invention is to provide a circuit simulation model extracting method and device that can be reduced the number of circuit model preparation steps and mistakes in preparation.

The circuit simulation model extracting device of the present invention comprises a memory unit, a extracting unit, a circuit model conversion unit, and a simulation unit.

The memory unit stores logic information expressing a plurality of logic function elements constituting a logic circuit, and wiring information about a plurality of components that correspond to the plurality of logic function elements on a printed circuit board. The extracting unit extracts the wiring information and logic information to be used for executing circuit simulation from among the wiring information and logic information stored in the memory unit.

The circuit model conversion unit converts the wiring information and logic information extracted by the extracting unit into a circuit model suitable for executing the circuit simulation. The simulation unit executes the circuit simulation based on the circuit model converted by the circuit model conversion unit, and identifies the electrical characteristics between the plurality of components that correspond to the wiring information and logic information extracted by the extracting unit.

The present invention also comprises the following additional constituent elements.

The memory unit stores, as wiring information for a plurality of printed circuit boards, a driver for performing driving based on signals from a power source, a receiver for receiving the signals, and a net for expressing a wiring that interconnects the driver and the receiver. The extracting unit extracts, from among the wiring information for the plurality of printed circuit boards stored in the memory unit, the wiring information about the printed circuit boards that is to be used for executing the circuit simulation.

The circuit model conversion unit comprises a subcircuit storage unit, a power source circuit, a driver circuit, a line circuit, and a receiver circuit. The subcircuit storage unit stores as circuit simulation data a power source subcircuit corresponding to the power source, a driver subcircuit corresponding to the driver, a receiver subcircuit corresponding to the receiver, and a line subcircuit corresponding to the net.

The power source circuit reads the power source subcircuit from the subcircuit storage unit. The driver circuit, which is connected to the power source subcircuit, converts the driver into the driver subcircuit stored in the subcircuit storage unit. The line circuit, which is connected to the driver subcircuit, converts the net into the line subcircuit stored in the subcircuit storage unit. The receiver circuit, which is connected to the line subcircuit, converts the receiver into the receiver subcircuit stored in the subcircuit storage unit.

The extracting unit extracts a plurality of nets from the wiring information when the nets are contained in the wiring information. The line circuit converts a plurality of parts of the nets into a single line, and remaining a plurality of parts of the nets into a plurality of lines when the parts of the nets extracted by the extracting unit are close to each other.

The extracting unit also extracts a plurality of nets from the wiring information when the nets are contained in the wiring information. The line circuit converts a plurality of parts of the nets as capacitors, and remaining a plurality of parts of the nets into a plurality of lines when the parts of the nets extracted by the extracting unit are orthogonal to each other.

The extracting unit further extracts a plurality of nets from the wiring information when the nets are contained in the wiring information. The circuit model conversion unit converts the wiring information into the subcircuits for each of the nets.

For each net, the circuit model conversion unit retrieves a plurality of parts of the nets as close nets based on the wiring information. For each net, the circuit model conversion unit retrieves a plurality of parts of the nets as orthogonal nets based on the wiring information.

The circuit model conversion unit further comprises a net designation unit for designating the net to be used for executing the circuit simulation from among a plurality of nets when the nets are contained in the wiring information. The device also comprises a net retrieval unit for retrieving close nets that are close to a designated net when this net has been designated by the net designation unit.

The device also comprises a net retrieval unit for retrieving orthogonal nets that are orthogonal to a designated net when this net has been designated by the net designation unit. The circuit model conversion unit further comprises a receiver designation unit for designating the receiver to be used for executing the circuit simulation from among a plurality of receivers when these receivers are contained in the wiring information.

The device also comprises a net retrieval unit for retrieving close nets that are close to a designated receiver when this receiver has been designated by the receiver designation unit. The device further comprises a net retrieval unit for retrieving orthogonal nets that are orthogonal to a designated receiver when this receiver has been designated by the receiver designation unit.

The circuit model conversion unit also comprises a direction conversion unit for converting a diagonal wiring into a wiring parallel to the horizontal direction in a cartesian coordinate system when the diagonal wiring is contained in the wiring information and the angle of the diagonal wiring with a prescribed line is equal to or less than a prescribed angle, and for converting the diagonal wiring into a wiring parallel to the vertical direction when the angle exceeds the prescribed angle.

The line circuit converts a plurality of nets into the line subcircuit when these nets are contained in the wiring information and the distance between the nets is equal to or less than a prescribed distance, and converts none of the nets into the line subcircuit when the distance between the nets exceeds the prescribed distance.

The line circuit converts a plurality of parts of a plurality of nets into a line subcircuit when the plurality of nets are contained in the wiring information and the parts of the nets are close to each other and exceed a prescribed length, and converts none of the parts of the nets into the line subcircuit when the parts of the nets are equal to or less than the prescribed length.

The circuit model conversion unit also comprises an interlayer distance computation unit for computing the distance between the wiring of the self-layer and the wiring of another layer when the printed circuit board is a printed circuit board with a multilayer structure, and preparing a capacitive subcircuit according to the distance.

The circuit model conversion unit further comprises a junction-via processing unit for converting into a capacitive subcircuit a junction via that connects the wiring of the self-layer with the wiring of another, adjacent layer when the printed circuit board is a printed circuit board with a multilayer structure.

The circuit model conversion unit further comprises a compression circuit for compressing a first circuit and a second circuit connected to the first circuit into yet another single circuit when the first circuit, which is selected from among the power source circuit, the driver circuit, the line circuit, and the receiver circuit, is the same as the second circuit.

The circuit model conversion unit also comprises a resistance circuit for allocating a resistance subcircuit between the power source subcircuit and a pin subcircuit when a pin for inputting signals, the net connected to the pin, and the receiver connected to the net are contained in the wiring information. The device further comprises a look-up table for storing electrical parameters corresponding to blocks of wiring information for the plurality of printed circuit boards.

The circuit model conversion unit reads from the look-up table electrical parameters corresponding to the wiring information about printed circuit boards to be used for executing the circuit simulation and adds the electrical parameters to the wiring information.

When a single target net and one or more influence nets are contained in the wiring information, and the single target net is a status of the least one of close and orthogonal to the one or more influence nets, the circuit model conversion unit prepares a separate circuit model expressing the relation between the single target net and each influence net for each of the one or more influence nets.

The simulation unit performs circuit simulation based on the separate circuit models prepared by the circuit model conversion unit for each influence net, measures individual instances of a crosstalk noise, and combines the individual instances of crosstalk noise measured for each of the influence nets, thereby computing the crosstalk noise which the single target net receives from the one or more influence nets.

(Circuit Simulation Model Extracting Method Of The Present Invention)

Next, the circuit simulation model extracting method of the present invention comprises a storage step, a extracting step, a circuit model conversion step, and a simulation step. The storage step involves storing logic information expressing a plurality of logic function elements constituting a logic circuit, and wiring information about a plurality of components that correspond to the plurality of logic function elements on a printed circuit board. The extracting step involves extracting the wiring information and logic information to be used for executing circuit simulation from among the wiring information and logic information stored in the storage step. The circuit model conversion step involves converting the wiring information and logic information extracted by the extracting step into a circuit model suitable for executing the circuit simulation.

The simulation step involves executing the circuit simulation based oh the circuit model converted in the circuit model conversion step, and identifying the electrical characteristics between the plurality of components that correspond to the wiring information and logic information extracted by the extracting step.

The present invention also comprises the following additional process.

In this additional process, the storage step involves storing, as wiring information for a plurality of printed circuit boards, a driver for performing driving based on signals from a power source, a receiver for receiving the signals, and a net for expressing a wiring that interconnects the driver and the receiver. The extracting step involves extracting, from among the wiring information for the plurality of printed circuit boards stored in the storage step, the wiring information about the printed circuit boards that is to be used for executing the circuit simulation.

The circuit model conversion step comprises a subcircuit storage step, a power source step, a driver step, a line step, and a receiver step. The subcircuit storage step involves storing as circuit simulation data a power source subcircuit corresponding to the power source, a driver subcircuit corresponding to the driver, a receiver subcircuit corresponding to the receiver, and a line subcircuit corresponding to the net.

The power source step involves reading the power source subcircuit stored in the subcircuit storage step. The driver step involves converting the driver with the aid of a driver circuit into the driver subcircuit stored in the subcircuit storage step. The line step involves converting the net with the aid of a line circuit into the line subcircuit stored in the subcircuit storage step. The receiver step involves converting the receiver with the aid of a receiver circuit into the receiver subcircuit stored in the subcircuit storage step.

The extracting step involves extracting a plurality of nets from the wiring information when the nets are contained in the wiring information. The line step involves converting a plurality of parts of the nets into a single line, and remaining a plurality of parts of the nets into a plurality of lines when the parts of the nets extracted in the extracting step are close to each other.

The extracting step also involves extracting a plurality of nets from the wiring information when the nets are contained in the wiring information. The line step involves converting a plurality of parts of the nets as capacitors, and the remaining a plurality of parts of the nets into a plurality of lines when the parts of the nets extracted in the extracting step are orthogonal to each other.

The extracting step further involves extracting a plurality of nets from the wiring information when the nets are contained in the wiring information. The circuit model conversion step involves converting the wiring information into the subcircuits for each of the plurality of nets.

For each net, the circuit model conversion step involves retrieving a plurality of parts of the nets as close nets on the basis of the wiring information. For each net, the circuit model conversion step involves retrieving a plurality of parts of the nets as orthogonal nets on the basis of the wiring information.

The circuit model conversion step further comprises a net designation step for designating the net to be used for executing the circuit simulation from among a plurality of nets when the nets are contained in the wiring information.

There is also a net retrieval step for retrieving close nets that are close to a designated receiver when this receiver has been designated in the designation step. In addition, there is a net retrieval step for retrieving orthogonal nets that are orthogonal to a designated receiver when this receiver has been designated in the receiver designation step.

The circuit model conversion step further comprises a receiver designation step for designating the receiver to be used for executing the circuit simulation from among a plurality of receivers when the plurality of receivers are contained in the wiring information.

There is also a net retrieval step for retrieving close nets that are close to a designated receiver when this receiver has been designated in the receiver designation step. In addition, there is a net retrieval step for retrieving orthogonal nets that are orthogonal to a designated receiver when this receiver has been designated in the receiver designation step.

The circuit model conversion step also comprises a direction conversion step for converting a diagonal wiring into a wiring parallel to the horizontal direction in a cartesian coordinate system when the diagonal wiring is contained in the wiring information and the angle of the diagonal wiring with a prescribed line is equal to or less than a prescribed angle, and for converting the diagonal wiring into a wiring parallel to the vertical direction when the angle exceeds the prescribed angle.

The line step involves converting a plurality of nets into the line subcircuit when the nets are contained in the wiring information and the distance between the nets is equal to or less than a prescribed distance, and converting none of the nets into the line subcircuit when the distance between the nets exceeds the prescribed distance.

The line step involves converting a plurality of parts of a plurality of nets into a line subcircuit when a plurality of nets are contained in the wiring information and the parts of the nets are close to each other and exceed a prescribed length, and converting none of the parts of the nets into a line subcircuit when the parts of the nets are equal to or less than the prescribed length.

The circuit model conversion step also comprises an interlayer distance computation step for computing the distance between the wiring of the self-layer and the wiring of another layer when the printed circuit board is a printed circuit board with a multilayer structure, and for preparing a capacitive subcircuit according to the distance.

The circuit model conversion step further comprises a junction-via processing step for converting a junction via that connects the wiring of the self-layer with the wiring of another, adjacent layer into a capacitive subcircuit when the printed circuit board is a printed circuit board with a multilayer structure.

The circuit model conversion step further comprises a compression step for compressing a first circuit and a second circuit connected to the first circuit into yet another single circuit when the first circuit, which is selected from among the power source circuit, the driver circuit, the line circuit, and the receiver circuit, is the same as the second circuit.

The circuit model conversion step also comprises a resistance generation step for allocating a resistance subcircuit between the power source subcircuit and pin subcircuit when a pin for inputting signals, the net connected to the pin, and the receiver connected to the net are contained in the wiring information.

There is also a preparation step for preparing a look-up table for storing electrical parameters corresponding to pieces of wiring information for the plurality of printed circuit boards.

The circuit model conversion step involves reading from the look-up table prepared in the preparation step electrical parameters corresponding to the wiring information about printed circuit boards to be used for executing the circuit simulation, and adding the electrical parameters to the wiring information.

When a single target net and one or more influence nets are contained in the wiring information, and the single target net is a status of the least one of close and orthogonal to the one or more influence nets, the circuit model conversion step involves preparing a separate circuit model expressing the relation between the single target net and each influence net for each of the one or more influence nets.

The simulation step involves executing circuit simulation based on the separate circuit models prepared in the circuit model conversion step for each influence net, measuring individual instances of a crosstalk noise, and combining the individual instances of crosstalk noise measured for each of the influence nets, thereby computing the crosstalk noise which the single target net receives from the one or more influence nets.

First, in accordance with the present invention, the extracting step involves extracting the logic information to be used for executing circuit simulation and the wiring information corresponding to this logic information from among the wiring information and logic information stored.

Then, the circuit model conversion step involves converting the extracted wiring information and logic information into a circuit model suitable for executing the circuit simulation. The simulation step involves executing the circuit simulation on the basis of the circuit model converted, and identifying the electrical characteristics between the plurality of components that correspond to the wiring information and logic information sampled.

Specifically, the number of preparation steps and preparation mistakes can be reduced because the circuit model is prepared automatically.

When wiring information is converted into the circuit model, a power source subcircuit is prepared by a power source circuit, the driver is converted into a driver subcircuit by a driver circuit, the net is converted into a line subcircuit by a line circuit, and the receiver is converted into a receiver subcircuit by a receiver circuit. Electrical characteristics between the driver and the receiver can therefore be measured by executing circuit simulation on the basis of signals from the power source.

A line step involves converting the parts of the extracted nets into a single line when the parts of the nets are close to each other. In addition, the line step involves converting the parts of the nets into a capacitor when the parts of the nets are orthogonal to each other. Specifically, accurate electrical characteristics can be measured because a circuit model corresponding to the actual wiring is prepared.

Wiring information can be converted into a subcircuit for each net based on the wiring information, and close nets can be retrieved for each net based on the wiring information. The circuit model conversion allows orthogonal nets to be retrieved for each net based on the wiring information, and the net to be used for executing circuit simulation to be designated from among a plurality of nets.

It is also possible to retrieve close nets that are close to a designated net when this net has been designated, and to retrieve orthogonal nets that are orthogonal to a designated net when this net has been designated.

It is further possible to designate the receiver to be used for executing circuit simulation from among a plurality of receivers, and to retrieve close nets that are close to this designated receiver. Orthogonal nets that are orthogonal to this designated receiver can also be retrieved.

A diagonal wiring can be made into a circuit model because the wiring can be converted into a horizontal-direction wiring or a vertical-direction wiring using a prescribed angle as reference. In addition, electrical characteristics in which actual wirings are taken into account can be obtained because circuit model conversion can be performed when the distance between nets exceeds a prescribed distance, and none of the circuit model conversion is performed when the close portion is equal to or less than the prescribed length.

Furthermore, electrical characteristics in which actual wirings are taken into account can be obtained because interlayer distance is computed, a capacitive subcircuit is prepared according to this distance, and the junction via is converted into the capacitive subcircuit.

The circuit model can be simplified because when the immediately preceding circuit is the same as the present circuit, these two circuits can be compressed.

Signal-induced oscillation can be prevented because a resistance circuit distributes the resistance subcircuit between a power source subcircuit and a pin subcircuit when input pins are connected to the receiver through nets.

In addition, accurate circuit simulation can be performed because electrical parameters corresponding to the wiring information about printed circuit boards to be used for executing the circuit simulation are read from the look-up table prepared, and the electrical parameters are added to the wiring information.

For each of the one or more influence nets, a separate circuit model is prepared expressing the relation between the single target net and each influence net. For each of the influence nets, the circuit simulation is performed by the separate circuit model prepared in the circuit model conversion step, and an individual instance of crosstalk noise is measured. In addition, accurate noise can be measured because the individual instances of crosstalk noise measured for each of the influence nets are combined to compute the crosstalk noise which the single target net receives from the one or more influence nets.

DESCRIPTION OF THE PREFERRED EMBODIMENTS

The circuit simulation model extracting method and device of the present invention will now be described with references to drawings.

First, the basic structure of the circuit simulation model extracting method and device of the present invention will be described with reference to FIG. 1 and FIG. 2.

(Basic Structure of the Present Invention)

Figure 1:
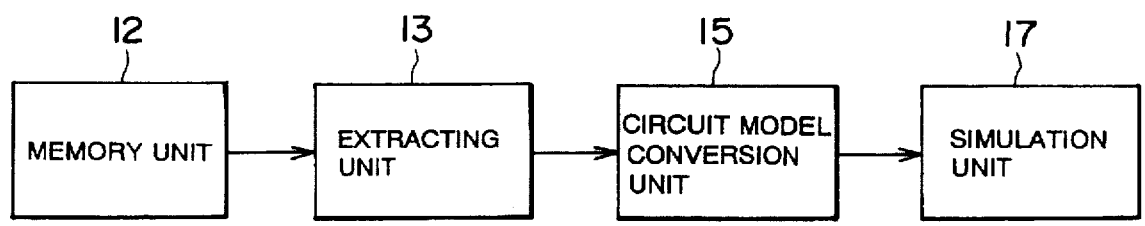
FIG. 1 is a diagram depicting the basic structure of the circuit simulation model extracting device of the present invention.
Figure 2:
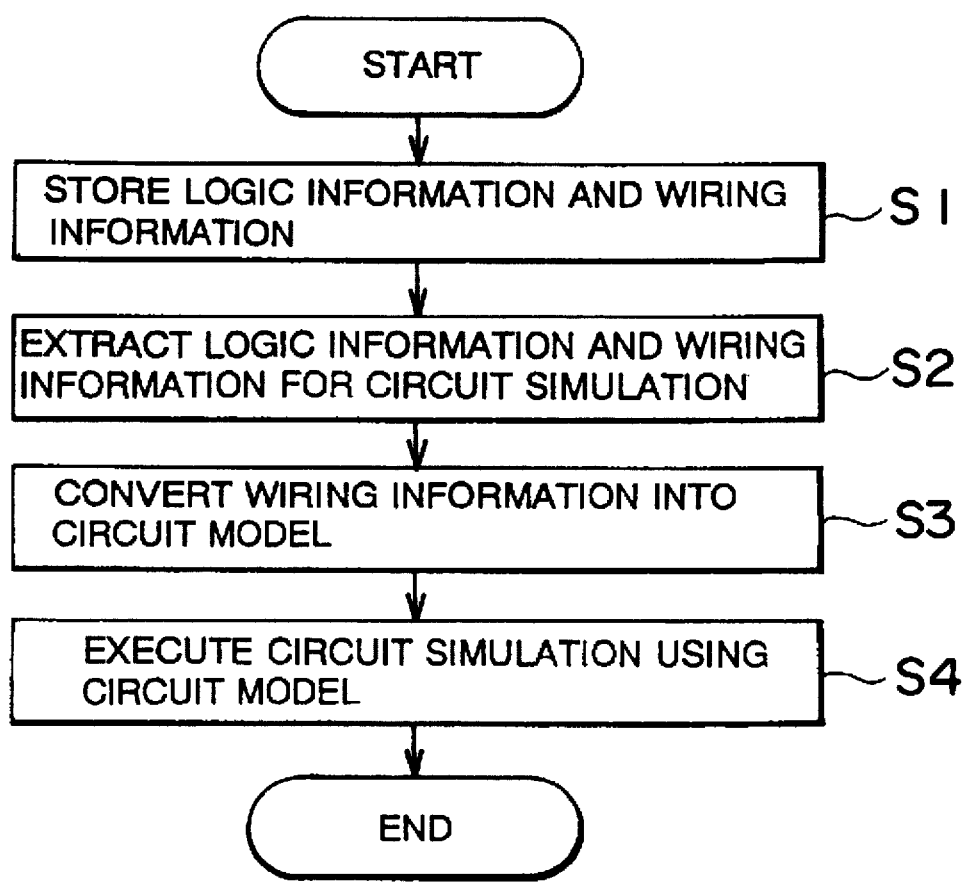
FIG. 2 is a diagram depicting the basic flow of the circuit simulation model extracting method of the present invention.

The circuit simulation model extracting device of the present invention comprises a memory unit 12, a extracting unit 13 connected to the memory unit 12, a circuit model conversion unit 15 connected to the extracting unit 13, and a simulation unit 17 connected to the circuit model conversion unit 15, as shown in FIG. 1.

The memory unit 12 stores logic information expressing a plurality of logic function elements constituting a logic circuit, and wiring information about a plurality of components that correspond to the plurality of logic function elements on a printed circuit board. The extracting unit 13 extracts the wiring information and logic information to be used for executing circuit simulation from among the wiring information and logic information stored in the memory unit 12.

The circuit model conversion unit 15 converts the wiring information and logic information extracted by the extracting unit 13 into a circuit model suitable for executing the circuit simulation.

The simulation unit 17 executes the circuit simulation on the basis of the circuit model converted by the circuit model conversion unit 15, and identifies the electrical characteristics between the plurality of components that correspond to the wiring information and logic information extracted by the extracting unit 13.

The memory unit 12 is, for example, a magnetic disk, a magnetooptical disk, or the like. The extracting unit 13 and circuit model conversion unit 15 represent, for example, functions realized through executing programs stored in memory by a central processing unit, that is, software.

A circuit simulation model extracting method realized by the circuit simulation model extracting device of the present invention thus configured will now be described.

First, the memory unit 12 stores logic information expressing a plurality of logic function elements constituting a logic circuit, and wiring information about a plurality of components that correspond to the plurality of logic function elements on a printed circuit board (Step S1).

Then, the extracting unit 13 samples the wiring information and logic information to be used for executing circuit simulation from among the wiring information and logic information stored in the memory unit 12 (Step S2).

Additionally, the circuit model conversion unit 15 converts the wiring information and logic information extracted by the extracting unit 13 into a circuit model suitable for executing the circuit simulation (Step S3).

The simulation unit 17 executes the circuit simulation on the basis of the circuit model converted by the circuit model conversion unit 15, and identifies the electrical characteristics between the plurality of components that correspond to the wiring information and logic information extracted by the extracting unit 13 (Step S4).

Thus, the number of preparation steps and preparation mistakes can be reduced because the circuit model is prepared automatically.

(Embodiment 1)

A specific embodiment of the circuit simulation model extracting device of the present invention will now be described.

Figure 3:
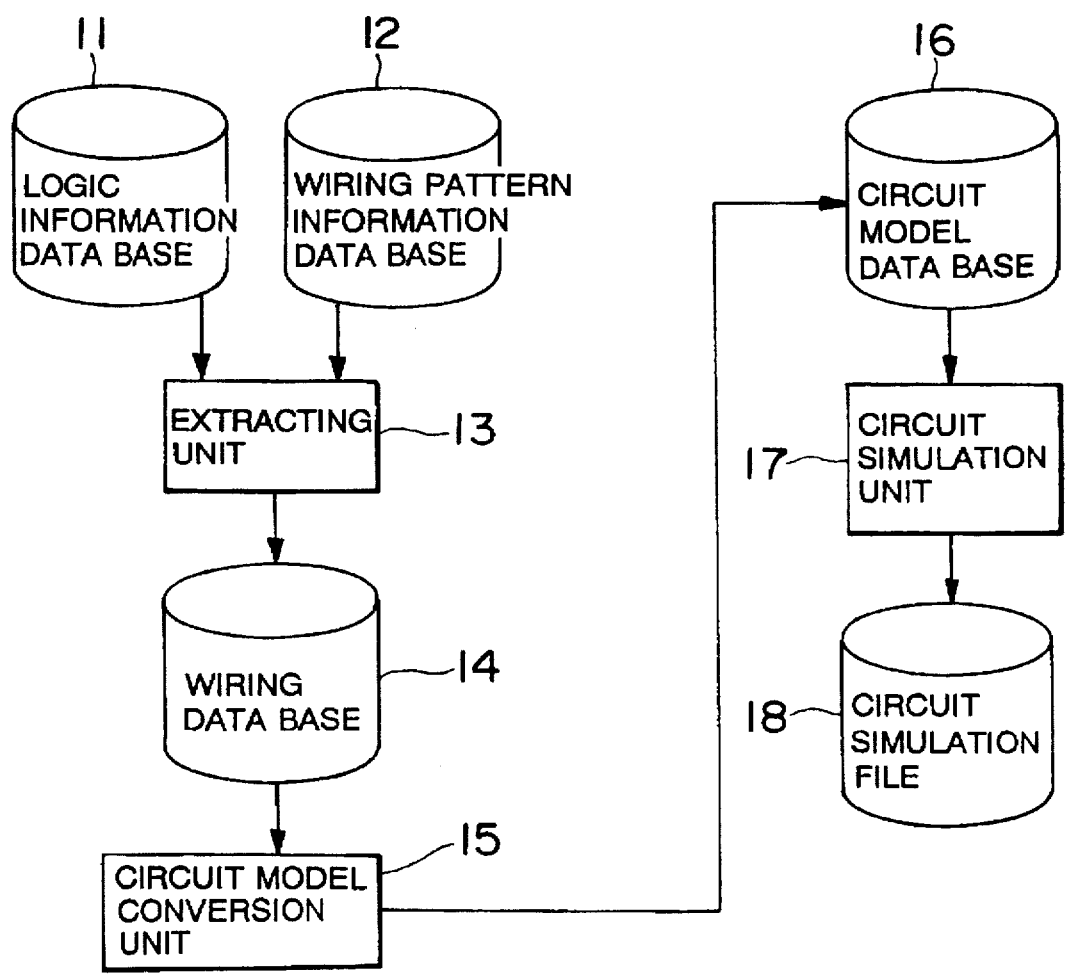
FIG. 3 is a diagram depicting a circuit simulation model extracting device made according to embodiment 1 of the present invention.

FIG. 3 is a block diagram that corresponds to embodiment 1 of the circuit simulation model extracting device of the present invention. The circuit simulation model extracting device comprises a logic information data base 11, a wiring pattern information data base 12, a extracting unit 13 connected to the two data bases 11 and 12, a wiring data base 14 connected to the extracting unit 13, and a circuit model conversion unit 15 connected to the wiring data base 14.

The circuit simulation model extracting device also comprises a circuit model data base 16 connected to the circuit model conversion unit 15, a circuit simulation unit 17 connected to the circuit model data base 16, and a circuit simulation file 18 connected to the circuit simulation unit 17.

The extracting unit 13, circuit model conversion unit 15, and circuit simulation unit 17 are software and represent functions realized by a central processing unit (not shown) executing processing programs stored in memory (not shown).

The logic information data base 11 is a magnetic disk or the like, and it stores logic information prepared by developers. The logic information is defined as logic function information (logic function name) expressing a plurality of logic function elements for a logic circuit, a net name expressing the logic connection information to be used to connect logic function elements to each other, or other type of information.

The wiring pattern information data base 12 is a magnetic disk or the like, and it stores physical information about the arrangement, shape, dimensions, and other packaging features of the components to be used for packaging a printed circuit board, or the wiring pitch, wiring pathways, pin positions of the components, degree of parallelism between wirings, closeness information, orthogonality information, and other types of wiring information.

The extracting unit 13 extracts logic information containing the logic function elements to be used for executing circuit simulation from among the logic information stored in the logic information data base 11, and extracts information about parallelism and orthogonality between the wirings or physical information about packaging or wiring corresponding to the logic information from among the wiring information stored in the wiring pattern information data base 12.

The logic information extracted is the driver and the receiver to be used for executing circuit simulation within a printed circuit board. The wiring data base 14 is a magnetic disk or the like, and it stores the wiring information and logic information extracted by the extracting unit 13.

The circuit model conversion unit 15 converts the wiring information stored by the wiring data base 14 into a circuit model suitable for executing circuit simulation by the circuit simulation unit 17. Here, the circuit model is a unit obtained by connecting a subcircuit suitable for executing the circuit simulation.

The circuit model data base 16 is a magnetic disk or the like, and it stores the circuit models converted by the circuit model conversion unit 15. The circuit simulation unit 17 executes circuit simulation based on the circuit models stored in the circuit model data base 16 and identifies the electrical characteristics between the components corresponding to the logic information extracted. The electrical characteristics are, for example, delay time, noise, and the like.

The circuit simulation file 18 is a magnetic disk or the like, and it stores the results of the circuit simulation executed by the circuit simulation unit 17.

Figure 4:
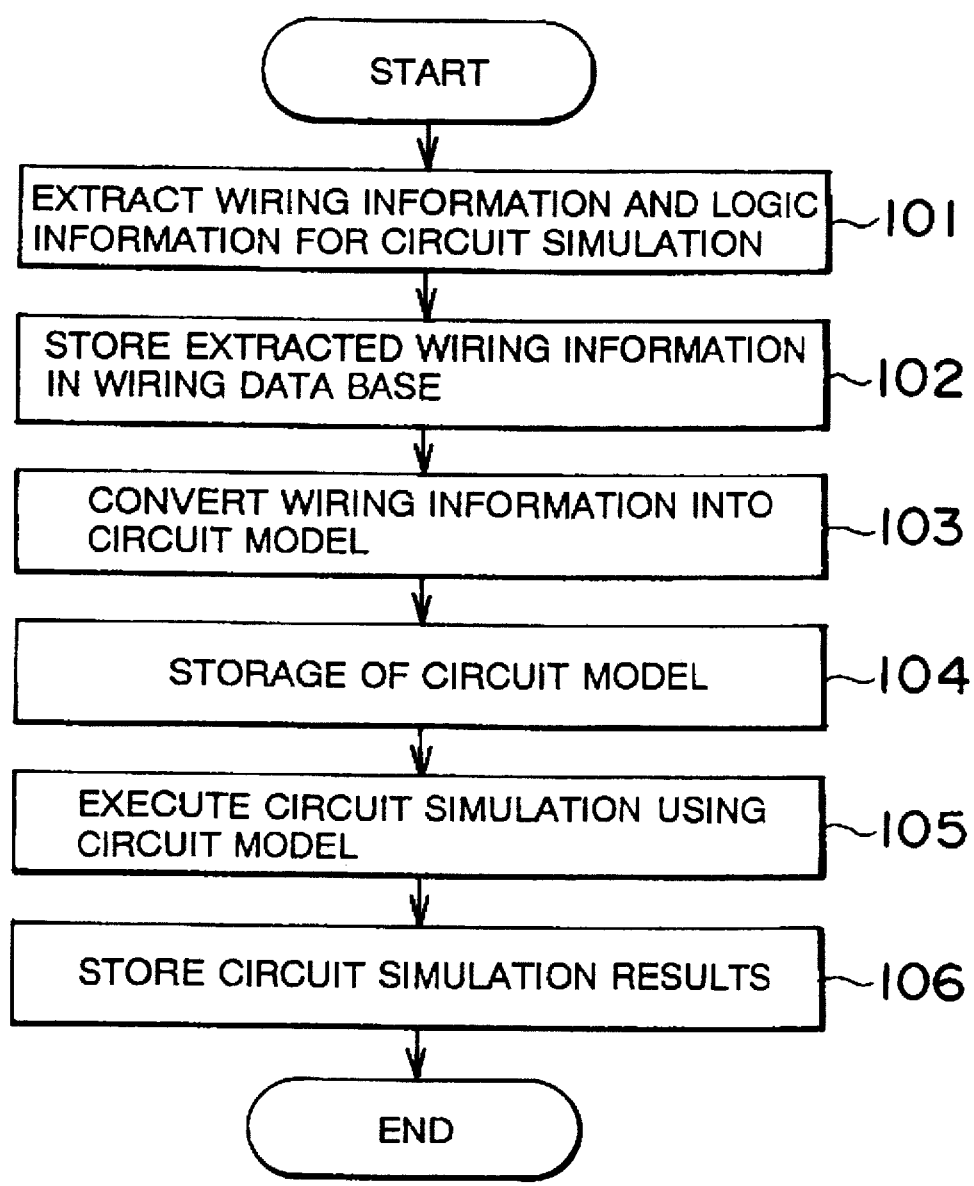
FIG. 4 is a flow chart depicting a circuit simulation model extracting method performed according to embodiment 1.

A circuit simulation model extracting method realized by the circuit simulation model extracting device of embodiment 1 thus configured will now be described with reference to FIG. 4. First, the extracting unit 13 extracts from the logic information data base 11 logic information about the driver to be used for executing circuit simulation and about the receiver that corresponds to the driver. The extracting unit 13 extracts wiring information that corresponds to the logic information extractd from the wiring pattern information data base 12 (Step 101).

The wiring data base 14 stores the wiring information and logic information extractd by the extracting unit 13 (Step 102). The circuit model conversion unit 15 converts the wiring information stored in the wiring data base 14 into a circuit model suitable for executing the circuit simulation (Step 103).

The circuit model data base 16 stores the circuit model converted by the circuit model conversion unit 15 (Step 104). The circuit simulation unit 17 executes circuit simulation based on the circuit model stored in the circuit model data base 16 and identifies the electrical characteristics between the components corresponding the logic information extractd (Step 105). The electrical characteristics are, for example, delay time, noise, and the like.

The circuit simulation file 18 stores the results of the circuit simulation executed by the circuit simulation unit 17 (Step 106).

Thus, the number of preparation mistakes and circuit model preparation steps can be reduced because the circuit simulation model extracting device prepares circuit models automatically based on logic information and wiring information. For example, the delay time or noise of the components being considered can also be accurately measured because the device performs circuit simulation based on accurate circuit models.

Figure 5:
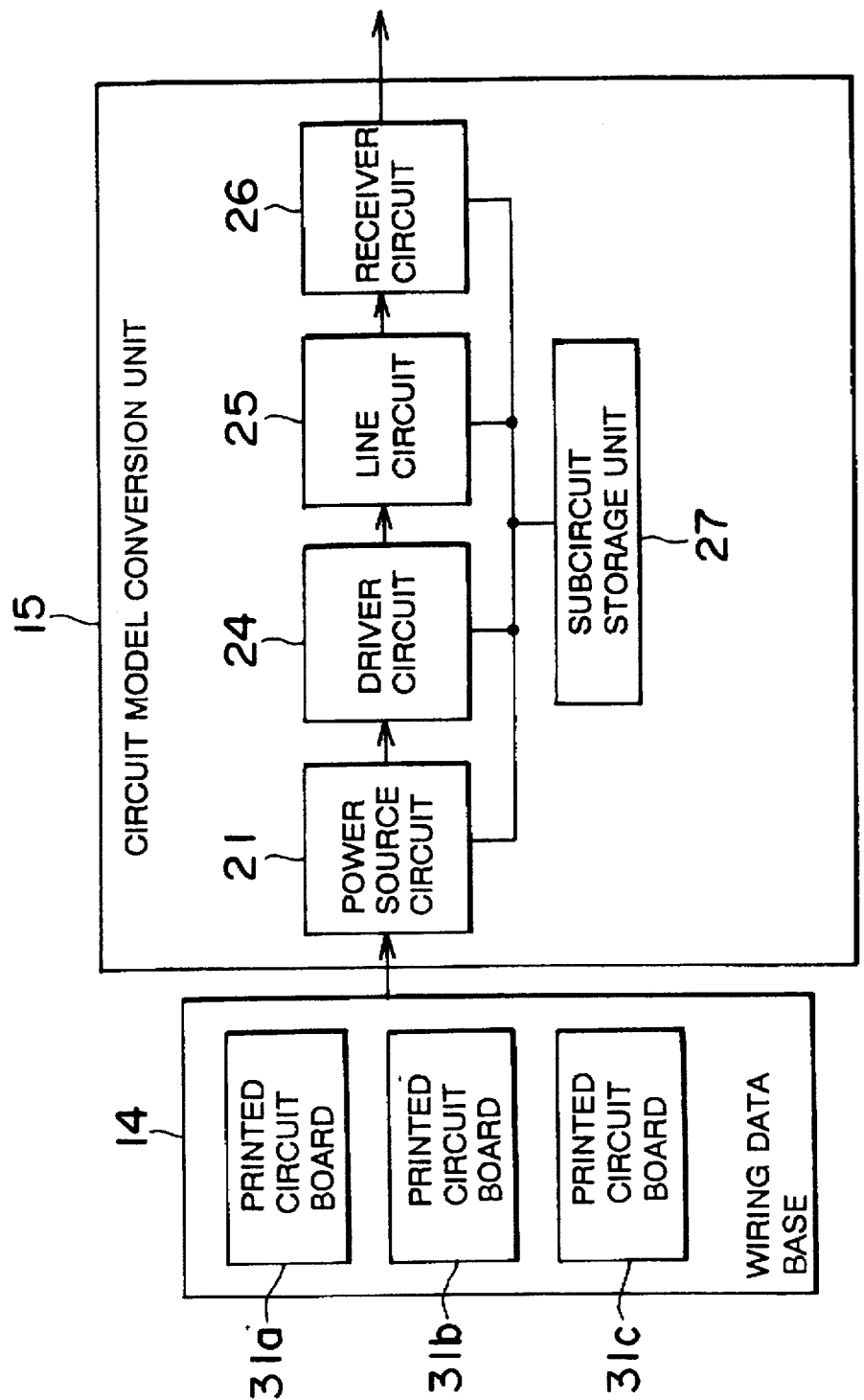
FIG. 5 is a block diagram of a circuit model conversion unit and a wiring data base.
Figure 6:
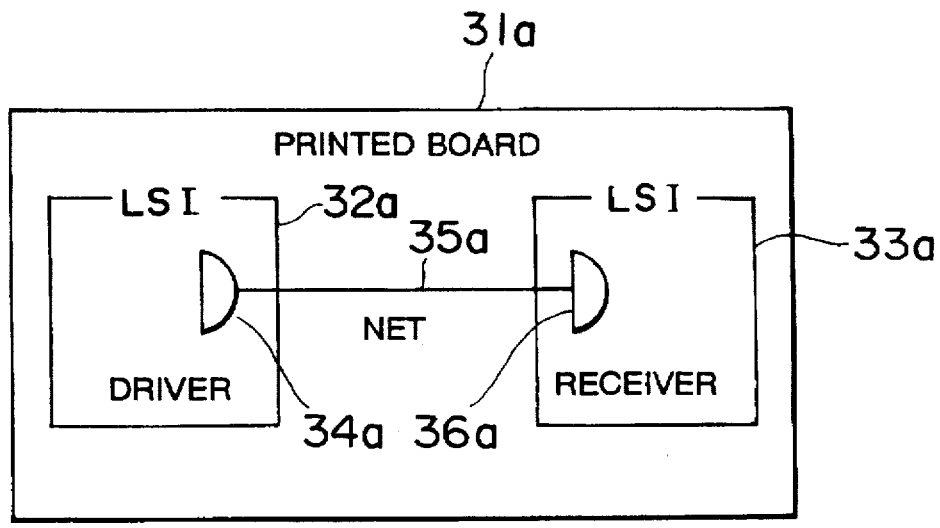
FIG. 6 is a diagram depicting a printed circuit board of simple wiring information.
Figure 8:
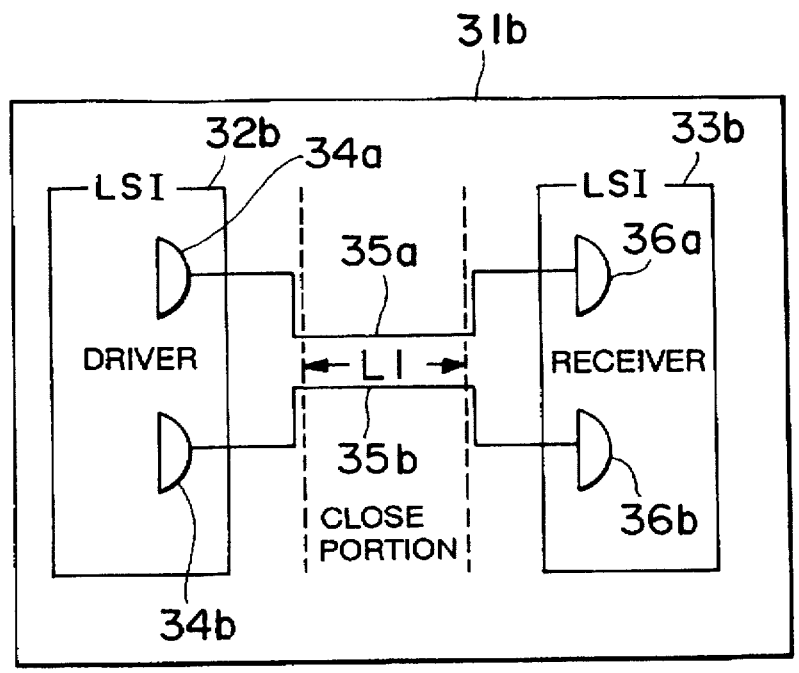
FIG. 8 is a diagram depicting a printed circuit board of wiring information having close nets.
Figure 10:
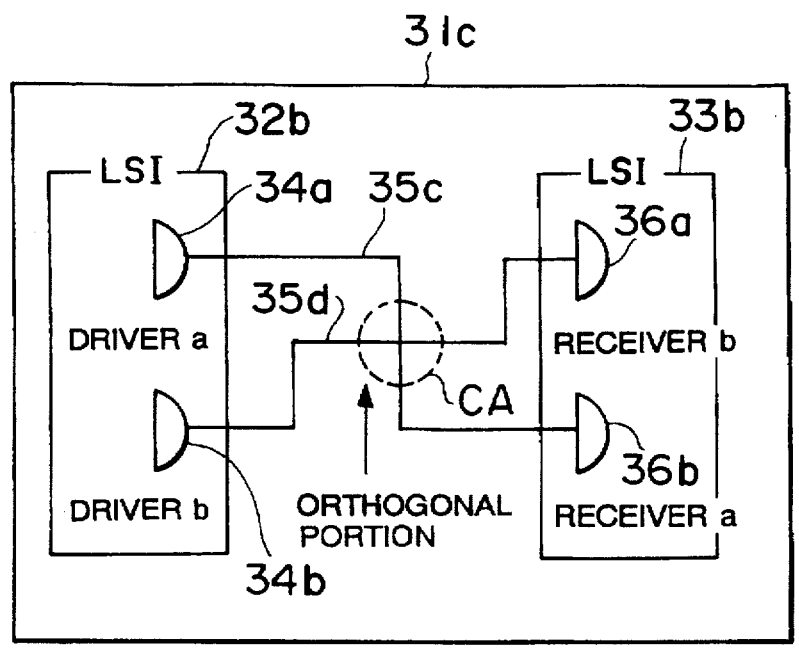
FIG. 10 is a diagram depicting a printed circuit board of wiring information having orthogonal nets.

The structure and operation of the circuit model conversion unit and wiring data base will now be described in further detail. A block diagram of the circuit model conversion unit 15 and wiring data base 14 is depicted in FIG. 5. In FIG. 5, the wiring data base 14 is connected to the circuit model conversion unit 15. The wiring data base 14 contains wiring information about a printed circuit board 31a, a printed circuit board 31b, and a printed circuit board 31c. The printed circuit board 31a of simple wiring information is depicted in FIG. 6. The printed circuit board 31b of wiring information having close nets is depicted in FIG. 8. The printed circuit board 31c of wiring information having orthogonal nets is depicted in FIG. 10.

The circuit model conversion unit 15 converts wiring information about the printed circuit boards 31a through 31c into circuit models.

The printed circuit board 31a depicted in FIG. 6 comprises a first LSI 32a having a driver 34a that is driven by signals from a power source (not shown), and a second LSI 33a having a receiver 36a for receiving signals. The receiver 36a is connected to the driver 34a through a net 35a.

The printed circuit board 31b depicted in FIG. 8 comprises a first LSI 32b having drivers 34a and 34b, and a second LSI 33b having receivers 36a and 36b for receiving signals. The receiver 36a is connected to the driver 34a through a net 35a that represents wiring. The receiver 36b is connected to the driver 34b through a net 35b. The nets 35a and 35b are placed close to each other at a prescribed net length L1.

The printed circuit board 31c depicted in FIG. 10 comprises a first LSI 32b having drivers 34a and 34b, and a second LSI 33b having receivers 36a and 36b for receiving signals. The receiver 36a is connected to the driver 34b through a net 35d, and these represent information about a first-layer printed circuit board. The receiver 36b is connected to the driver 34a through a net 35c, and these represent information about a second-layer printed circuit board. The first-layer net 35d and the second-layer net 35c are mutually orthogonal in a cross area CA. Because of this, there is a floating capacitance between the first-layer printed circuit board and the second-layer printed circuit board in the cross area CA.

Figure 7:
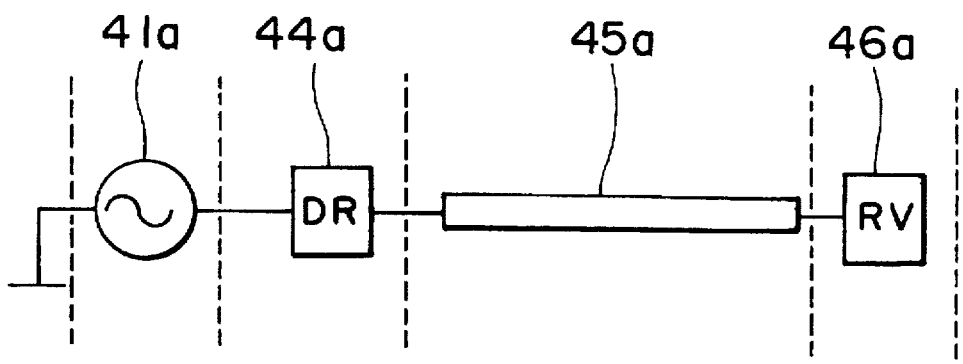
FIG. 7 is a diagram depicting a circuit model obtained by converting the simple wiring information.

The circuit model conversion unit 15 converts the wiring of the printed circuit board 31a depicted in FIG. 6 into the circuit model depicted in FIG. 7. The circuit model conversion unit 15 converts the wiring of the printed circuit board 31b depicted in FIG. 8 into the circuit model depicted in FIG. 9. The circuit model conversion unit 15 converts the wiring of the printed circuit board 31c depicted in FIG. 10 into the circuit model depicted in FIG. 11.

As shown in FIG. 5, the circuit model conversion unit 15 comprises a power source circuit 21 for driving the drivers 34a and 34b; a driver circuit 24 driven by the power source circuit 21; a line circuit 25 which is connected to the driver circuit 24 and which represents the nets 35a and 35b that connect LSIS to each other; a receiver circuit 26 connected to the line circuit 25; and a subcircuit storage unit 27 for storing, as circuit simulation data, a plurality of subcircuit types resulting from the use of the components.

The subcircuit storage unit 27 stores a plurality of subcircuit types that correspond to the wiring information of the printed circuit boards 31a through 31c.

The power source circuit 21, the driver circuit line circuit 25, and receiver circuit 26 are connected to the subcircuit storage unit 27. The power source circuit 21 outputs signals for measuring the electrical characteristics between LSIS.

Figure 12:
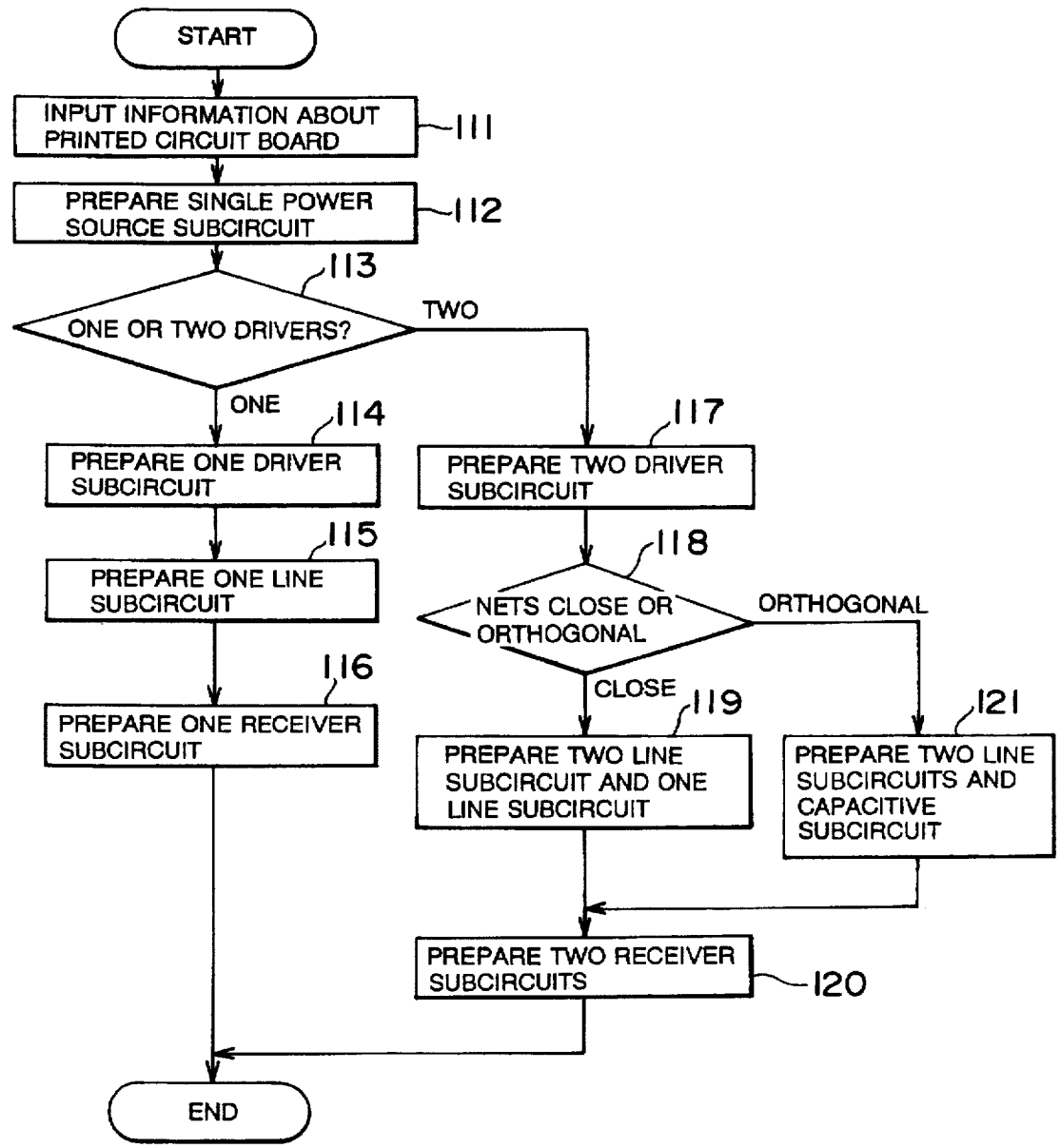
FIG. 12 is a flow chart depicting the operation of a circuit model conversion unit.

The operation of the wiring data base 14 and circuit model conversion unit thus configured will now be described with reference to FIG. 12. First, the circuit model conversion unit 15 reads the wiring information about one of the printed circuit boards 31a through 31c from the wiring data base 14 (Step 111). The power source circuit 21 reads a power subcircuit 41a stored in the subcircuit storage unit 27 (Step 112).

The circuit model conversion unit 15 then determines whether there is one or two drivers (Step 113).

Here, the wiring information about the printed circuit board 31a depicted in FIG. 6 is converted into the circuit model depicted in FIG. 7 when there is only one driver.

The driver circuit 24 reads from the subcircuit storage unit 27 a driver subcircuit 44a that corresponds to the driver 34a from the printed circuit board 31a, and connects this driver subcircuit 44a to the power subcircuit 41a (Step 114).

The line circuit 25 reads from the subcircuit storage unit 27 a line subcircuit 45a that corresponds to the net 35a from the printed circuit board 31a, and connects this line subcircuit 45a to the driver subcircuit 44a (Step 115).

The receiver circuit 26 reads from the subcircuit storage unit 27 a receiver subcircuit 46a that corresponds to the receiver 36a from the printed circuit board 31a, and connects this receiver subcircuit 46a to the line subcircuit 45a (Step 116).

A circuit model such as that depicted in FIG. 7 can thus be prepared. The electrical characteristics between the driver 34a and receiver 36a can therefore be measured by supplying signals from the power source circuit 21 using the circuit model.

If, on the other hand, it is determined in Step 113 that there are two drivers, then the driver circuit 24 reads from the subcircuit storage unit 27 the driver subcircuits 44a and 44b corresponding to the drivers 34a and 34b from the printed circuit board 31b, and connects the driver subcircuit 44a to the power subcircuit 41a (Step 117). The driver subcircuits 44a and 44b are prepared in the examples depicted in FIG. 9 and FIG. 11.

The line circuit 25 determines whether the two nets are close or orthogonal to each other (Step 118).

Figure 9:
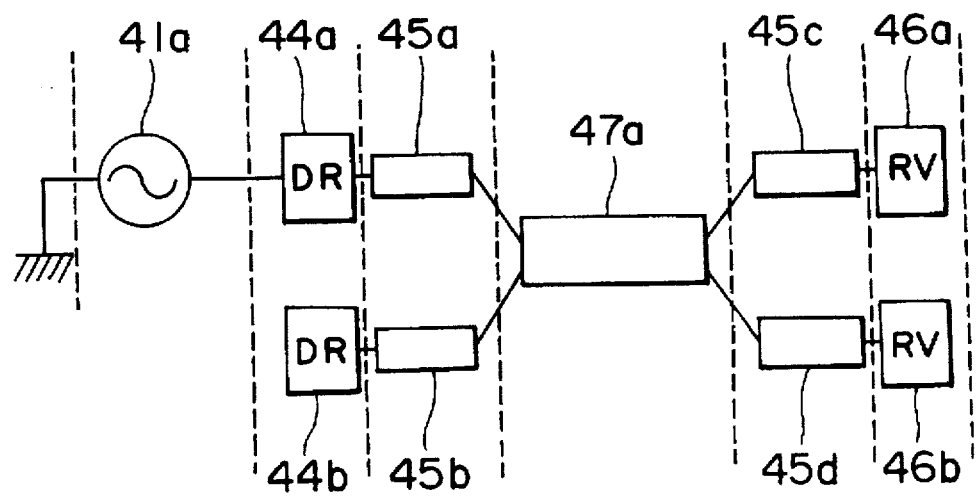
FIG. 9 is a diagram depicting a circuit model obtained by converting wiring information having close nets.

If the two nets are close to each other, wiring information about the printed circuit board 31b depicted in FIG. 8 is converted into the circuit model depicted in FIG. 9.

In this case, the line circuit 25 reads from the subcircuit storage unit 27 line subcircuits 45a and 45c corresponding to the net 35a from the printed circuit board 31a, line subcircuits 45b and 45d corresponding to the net 35b, and a single-line subcircuit 47a corresponding to the close portions of the nets 35a and 35b.

The line circuit 25 connects the line subcircuit 45a to the driver subcircuit 44a and single-line subcircuit 47a, and the line subcircuit 45b to the driver subcircuit 44b and single-line subcircuit 47a.

The line circuit 25 connects the line subcircuits 45c and 45d to the single-line subcircuit 47a (Step 119).

The receiver circuit 26 reads from the subcircuit storage unit 27 the receiver subcircuits 46a and 46b that correspond to the receivers 36a and 36b from the printed circuit board 31a, connects the receiver subcircuit 46a to the line subcircuit 45c, and connects the receiver subcircuit 46b to the line subcircuit 45d (Step 120).

This allows a circuit model having close nets such as those depicted in FIG. 9 to be prepared. The electrical characteristics between the two drivers 34a and 34b and the receivers 36a and 36b can therefore be measured even when the nets are close to each other by supplying the signals from the power source circuit 21 using the circuit model.

On the other hand, in Step 118, when two nets are orthogonal to each other, the line circuit 25 reads from the subcircuit storage unit 27 the line subcircuits 45a and 45c that correspond to the net 35c from the printed circuit board 31a, the line subcircuits 45b and 45d that correspond to the net 35d, and a capacitive subcircuit 48 that corresponds to the cross area CA of the nets 35a and 35b.

The line circuit 25 connects the line subcircuit 45a to the driver subcircuit 44a, line subcircuit 45c, and capacitive subcircuit 48. The line circuit 25 connects the line subcircuit 45b to the driver subcircuit 44b, line subcircuit 45d, and capacitive subcircuit 48 (Step 121).

In addition, the receiver circuit 26 performs the processing of Step 120.

Figure 11:
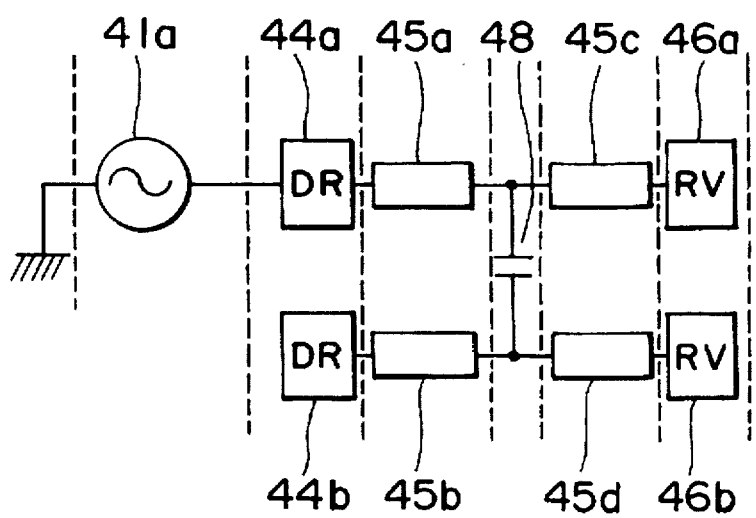
FIG. 11 is a diagram depicting a circuit model obtained by converting wiring information having orthogonal nets.

This allows a circuit model having close nets such as those depicted in FIG. 11 to be prepared. The electrical characteristics between the two drivers 34a and 34b and the receivers 36a and 36b can therefore be measured even when the nets are orthogonal to each other by supplying the signals from the power source circuit 21 using the circuit model.

(Embodiment 2)

Figure 13:
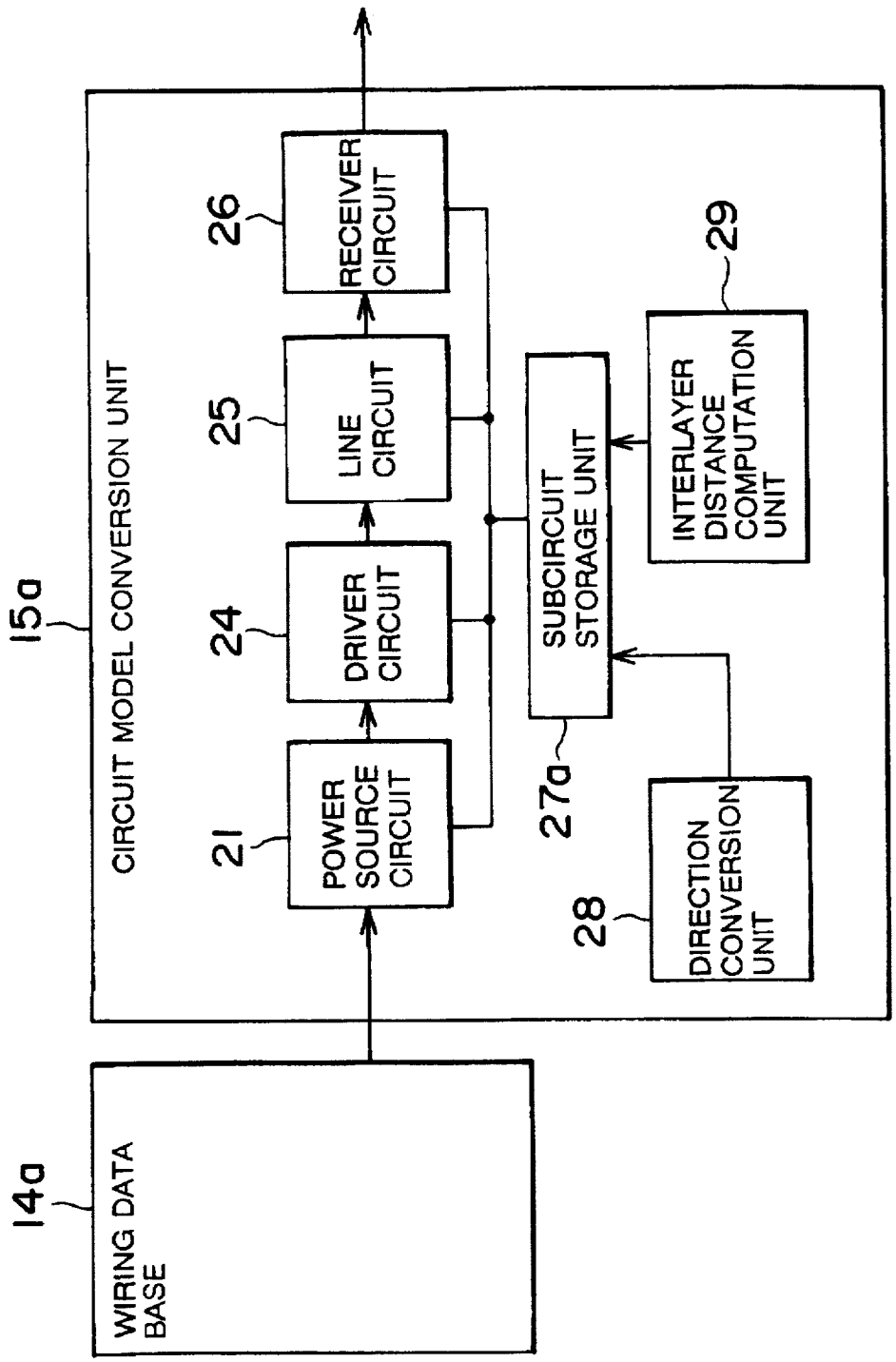
FIG. 13 is a block diagram depicting the circuit model conversion unit of embodiment 2.

Embodiment 2 involves performing circuit modeling for a printed circuit board with a multilayer structure and wiring processing for a diagonal wiring in which the wiring has an arbitrary angle. FIG. 13 depicts the structure thereof. As shown in FIG. 13, a circuit model conversion unit 15a comprises a direction conversion unit 28, an interlayer distance computation unit 29, a subcircuit storage unit 27a connected to the direction conversion unit 28 and interlayer distance computation unit 29, a power source circuit 21, a driver circuit 24, a line circuit 25, and a receiver circuit 26.

The direction conversion unit 28 converts the diagonal wiring into a wiring parallel to the X-axis (horizontal direction) of a cartesian coordinate system when the diagonal wiring having an arbitrary angle is equal to or less than a prescribed angle, and converts the diagonal wiring into a wiring parallel to the Y-axis (vertical direction) when the diagonal wiring exceeds the prescribed angle.

The interlayer distance computation unit 29 computes the distance between the wiring of the self-layer and the wiring of another layer in a printed circuit board with a multilayer structure, and prepares a capacitive subcircuit or the like according to this distance. The subcircuit storage unit 27a stores this capacitive subcircuit.

Figure 14:
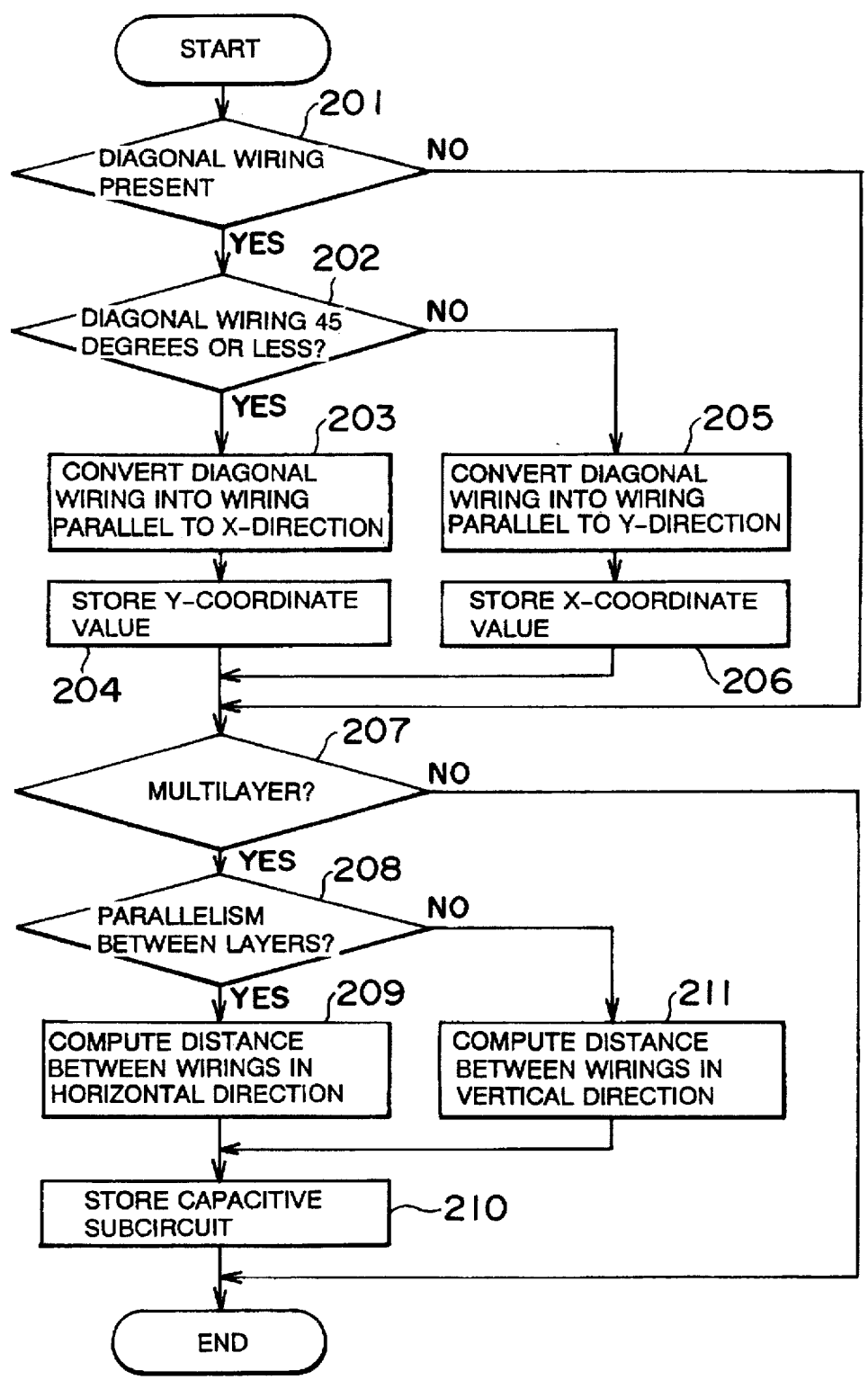
FIG. 14 is a flow chart depicting the operation of the circuit model conversion unit of embodiment 2.

The operation of embodiment 2 thus configured will now be described with reference to drawings. FIG. 14 is a flow chart depicting the operation of the circuit model conversion unit of embodiment 2.

First, the direction conversion unit 28 determines whether there is diagonal wiring (Step 201). If there is no diagonal wiring, the processing proceeds to Step 207.

If there is diagonal wiring, the direction conversion unit 28 determines whether the angle of the diagonal wiring with the X-axis is 45 degrees or less (Step 202).

Figure 15:
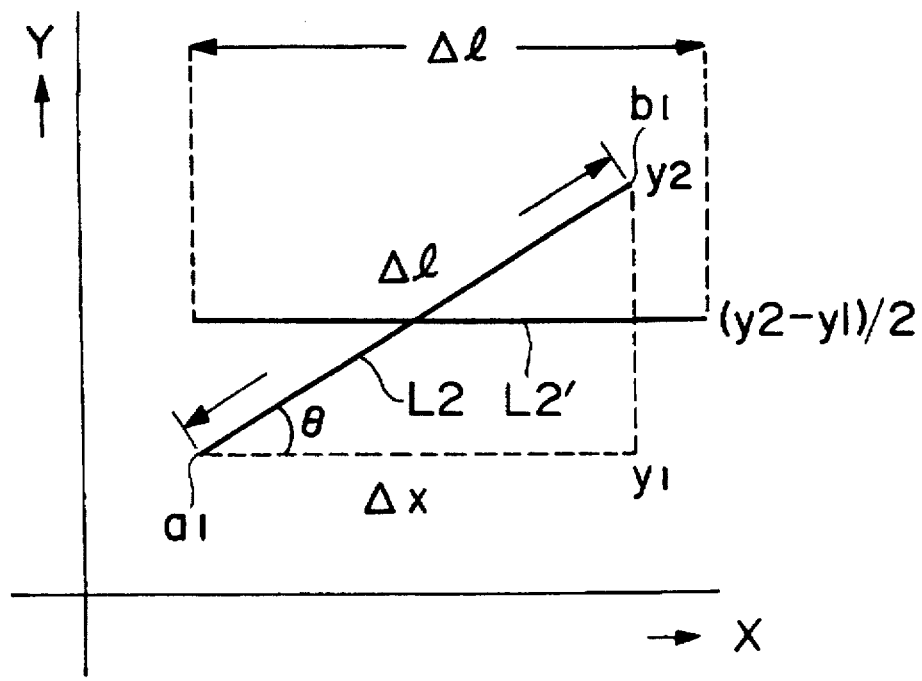
FIG. 15 is a diagram depicting circuit model conversion for a case in which the diagonal wiring is 45 degrees or less.

Here, if, as shown in FIG. 15, the angle of an arbitrary diagonal wiring L2 with the X-axis is 45 degrees or less, then the direction conversion unit 28 performs conversion to a wiring L2' parallel to the X-axis without changing the wiring length D1 thereof (Step 203).

In this case, the Y-coordinate value is (y2−y1)/2. y1 is the value of a point al at one end of the wiring L2, and y2 is the value of a point b1 at the other end of the wiring L2. This Y-coordinate value is stored in the subcircuit storage unit 27a (Step 204).

Figure 16:
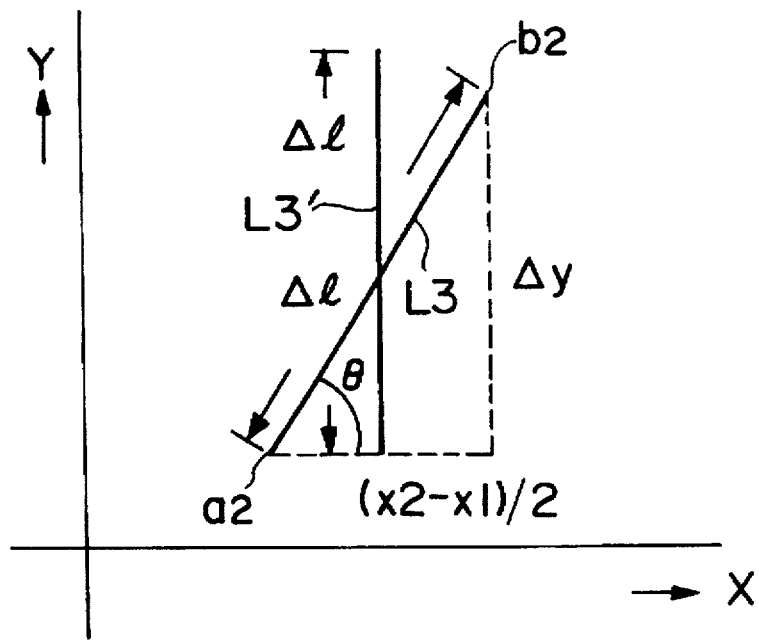
FIG. 16 is a diagram depicting circuit model conversion for a case in which the diagonal wiring exceeds 45 degrees.

On the other hand, if, as shown in FIG. 16, the angle of an arbitrary diagonal wiring L3 with the X-axis exceeds 45 degrees, then the direction conversion unit 28 performs conversion to a wiring L3' parallel to the Y-axis without changing the wiring length D1 thereof (Step 205).

In this case, the X-coordinate value is (x2−x1)/2. x1 is the value of a point a2 at one end of the wiring L3, and x2 is the value of a point b2 at the other end of the wiring L3. The subcircuit storage unit 27a stores the X-coordinate value converted by the direction conversion unit 28 as the line subcircuit used by the line circuit 25 (Step 206).

A circuit model for circuit simulation can thus be prepared because information about diagonal wiring is converted into information about orthogonal wiring even when wiring is done in a diagonal direction.

The interlayer distance computation unit 29 subsequently determines whether or not the printed circuit board is a multilayer structure (Step 207). Processing is completed if the printed circuit board is not a multilayer structure.

On the other hand, if the printed circuit board is a multilayer structure, the interlayer distance computation unit 29 determines whether the wirings between the multiple layers are parallel or orthogonal to each other (Step 208).

Figure 17:
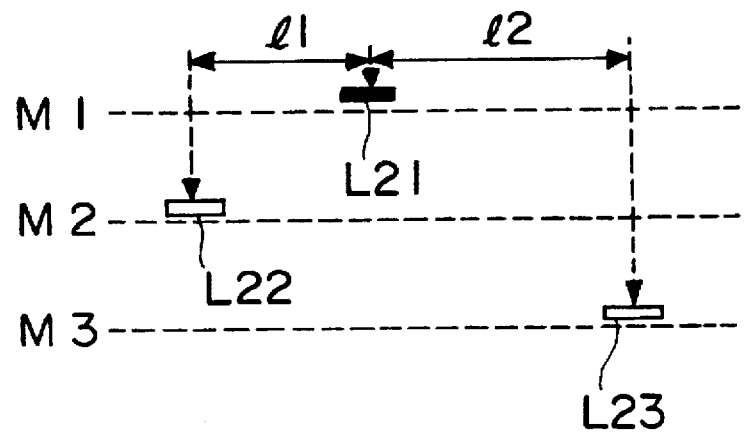
FIG. 17 is a diagram depicting parallel wiring between multiple layers.

Here, if, as shown in FIG. 17, the wirings L21 through L23 between the three layers M1 through M3 are parallel to each other, then the interlayer distance computation unit 29 computes the distance between the wirings in the horizontal direction, that is, the distance 11 from the wiring L21 to the wiring L22, and the distance 12 from the wiring L21 to the wiring L23 (Step 209).

The interlayer distance computation unit 29 then prepares an interlayer capacitive subcircuit according to the distance, and stores the capacitive subcircuit in the subcircuit storage unit 27a (Step 210).

Figure 18:
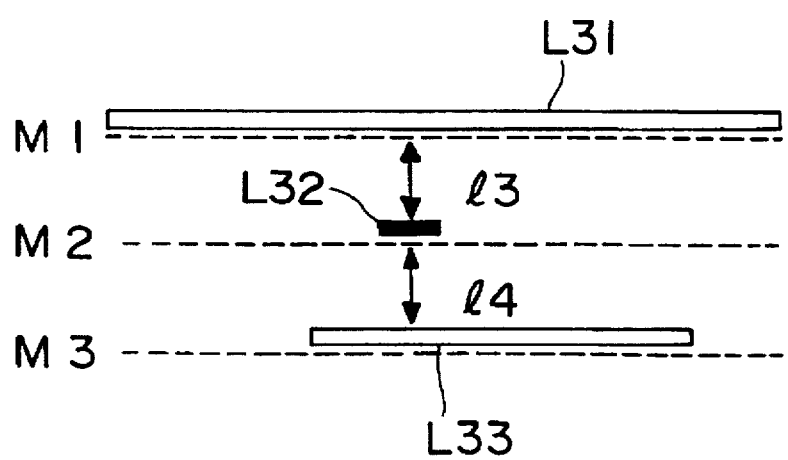
FIG. 18 is a diagram depicting orthogonal wiring between multiple layers.

On the other hand, if, as shown in FIG. 18, the wirings L31 through L33 between the three layers M1 through M3 are orthogonal to each other, then the interlayer distance computation unit 29 computes the distance between the wirings in the vertical direction, that is, the distance 13 from the wiring L32 to the wiring L31, and the distance 14 from the wiring L32 to the wiring L33 (Step 211).

The interlayer distance computation unit 29 then prepares an interlayer capacitive subcircuit according to the distance, and stores the capacitive subcircuit in the subcircuit storage unit 27a (Step 210).

Accurate electrical characteristics can thus be measured because a circuit model can be prepared with consideration for the effect of interlayer wiring even in a printed circuit board having a multilayer structure.

(Embodiment 3)

Figure 19:
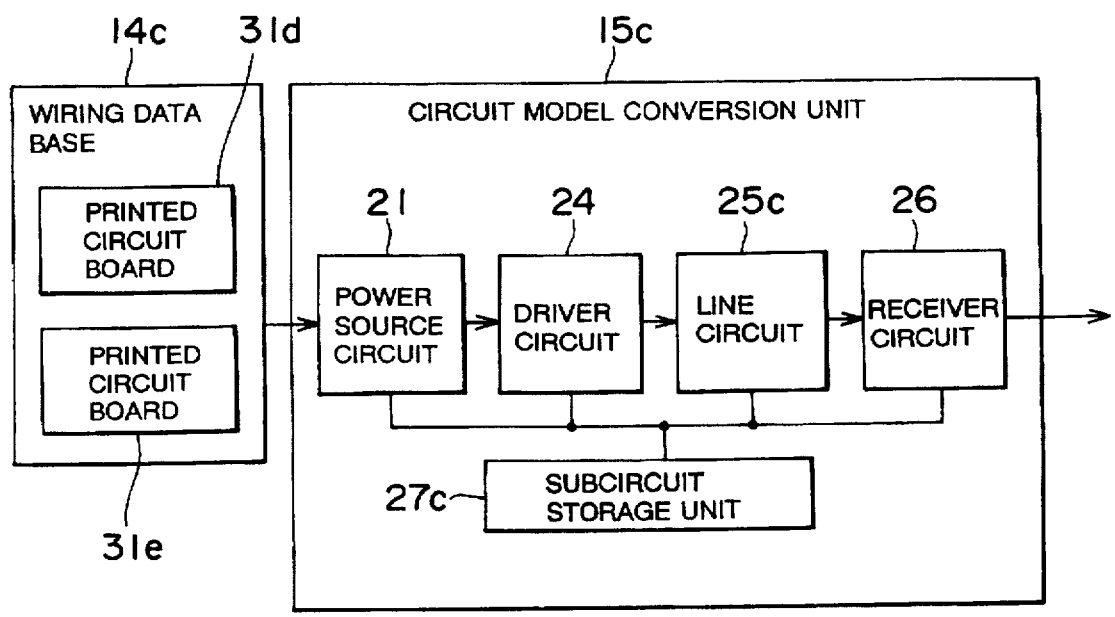
FIG. 19 is a diagram depicting the wiring data base and circuit model conversion unit of embodiment 3.

The circuit model conversion unit of embodiment 3 will now be described. The circuit model conversion unit of embodiment 3 and a wiring data base are depicted in FIG. 19. A wiring data base 14c stores wiring information about the printed circuit board 31d having three nets, as depicted in FIG. 20, and the printed circuit board 31e having two nets, as depicted in FIG. 21.

The circuit model conversion unit 15c basically has the same structure as in embodiment 1, although the structures of the line unit 25c and subcircuit storage unit 27c are different.

Figure 20:
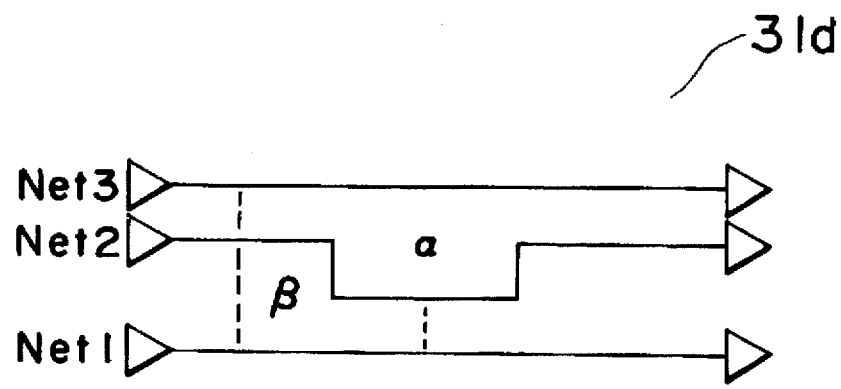
FIG. 20 is a diagram depicting a first example of close nets.

The printed circuit board 31d, as shown in FIG. 20, is parallel to the target net N1 and has a net N2 whose distance is α and a net N3 whose distance is β. The line unit 25c treats nets whose distance is equal to or less than a first prescribed value as close nets and executes circuit modeling as a single line. The line unit 25c does not treat nets whose close distance exceeds the first prescribed value as close nets, and does not execute circuit modeling.

Figure 21:
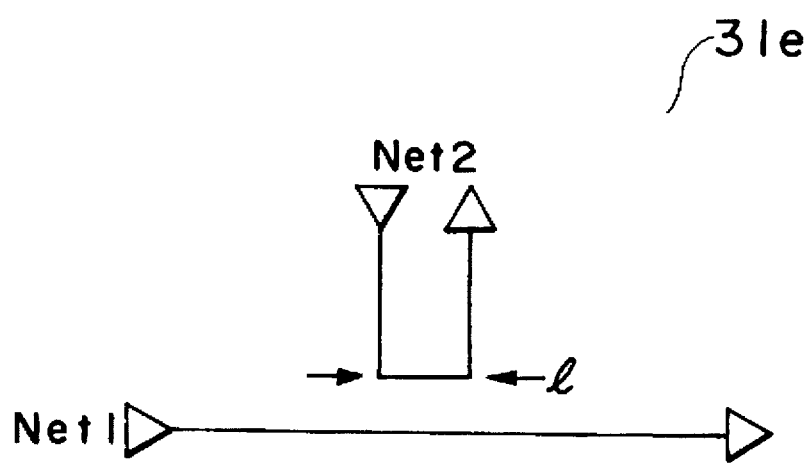
FIG. 21 is a diagram depicting a second example of close nets.

The printed circuit board 31e, as shown in FIG. 21, is parallel to the target net N1 and has a close net N2 that has a close portion 1 and a portion orthogonal to the target net N1.

The line unit 25c treats nets whose close distance 1 exceeds a second prescribed value as close nets and executes circuit modeling as a single line. The line unit 25c does not treat nets whose distance is equal to or less than the second prescribed value as close nets, and does not execute circuit modeling.

An accurate circuit model that corresponds to the wiring pattern can be prepared by performing processing in such a manner.

(Embodiment 4)

Figure 22:
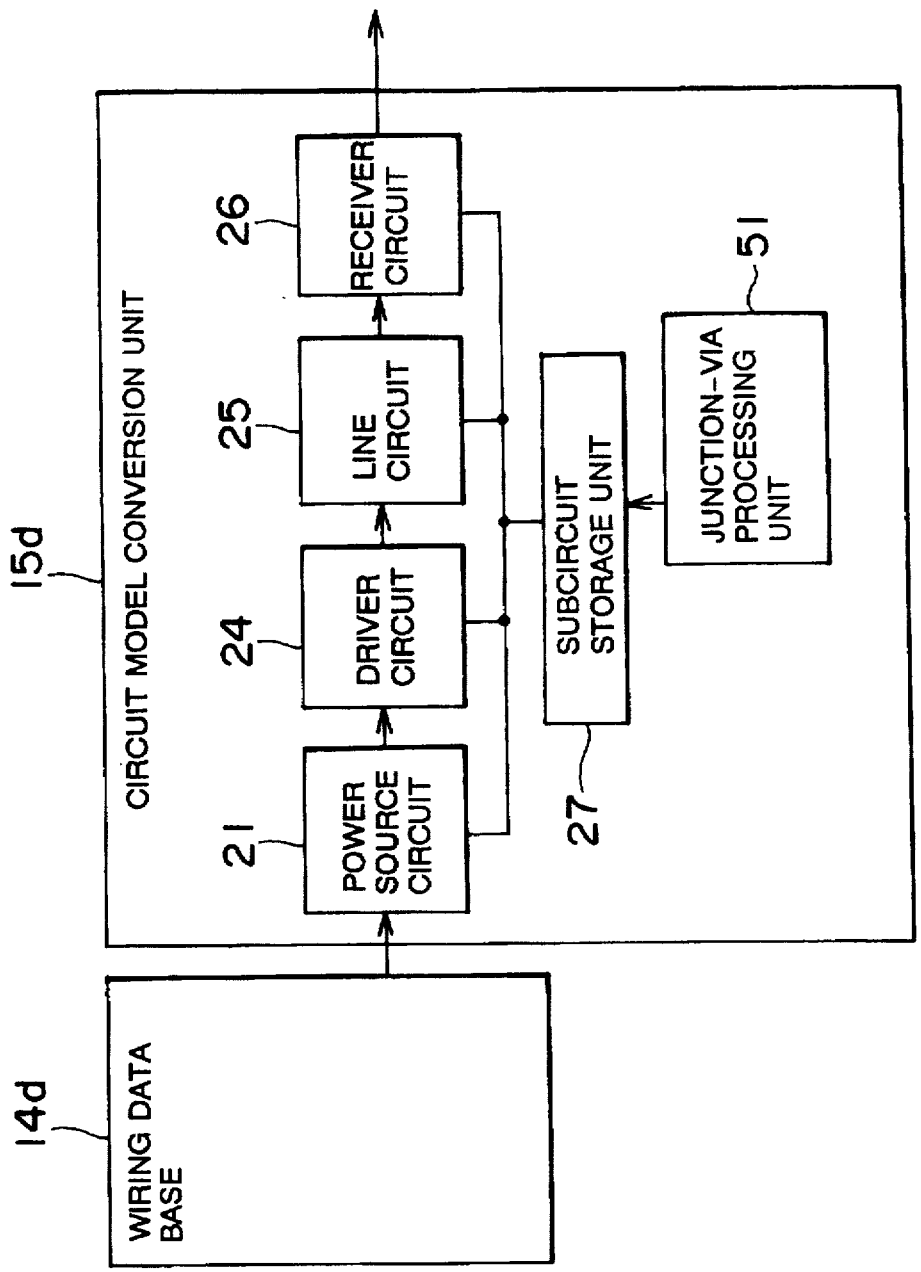
FIG. 22 is a diagram depicting the circuit model conversion unit of embodiment 4.

Next, the circuit model conversion unit of embodiment 4 is depicted in FIG. 22. The circuit model conversion unit 15d comprises a power source circuit 21, a driver circuit 24, a line circuit 25, a receiver circuit 26, a subcircuit storage unit 27, and a junction-via processing unit 51 connected to the subcircuit storage unit 27. The power source circuit 21, driver circuit 24, line circuit 25, receiver circuit 26, and subcircuit storage unit 27 have been described previously, and their description is therefore omitted here.

The junction-via processing unit 51 converts into a capacitive subcircuit the junction vias (through holes) that connect the wiring of the self-layer and the wiring of another, adjacent layer in a printed circuit board with a multilayer structure.

Figure 23:
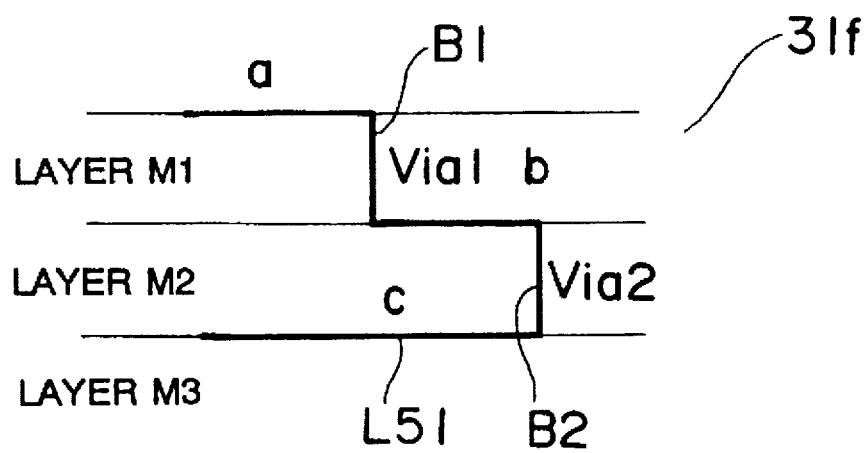
FIG. 23 is a diagram depicting the junction via of embodiment 4.

A wiring data base 14d stores wiring information about a multilayer-structure printed circuit board 32f composed of three layers M1 through M3 such as those shown in FIG. 23. In this case, the nets are sometimes configured between the layers through the junction vias. For example, as shown in FIG. 23, a net L51 comprises the net a of the layer M1, a net b composed of junction vias B1 and B2, and the net c of the layer M3.

Figure 24:
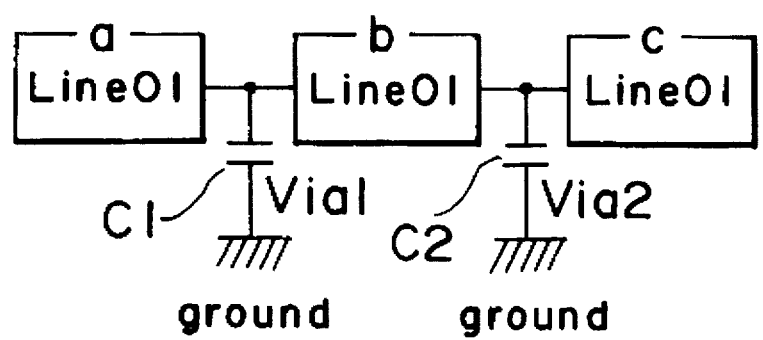
FIG. 24 is a diagram depicting a circuit model obtained by converting the Junction via of embodiment 4.

In such a case, a circuit model such as that in FIG. 24 can be prepared because the junction-via processing unit 51 converts the Junction via B1 into a capacitive subcircuit C1, and the junction via B2 into a capacitive subcircuit C2.

In addition, the line circuit 25 converts the net a into a line 01, the net b into a line 02, and the net c into a line 03.

Accurate electrical characteristics can be obtained because a circuit model corresponding to a printed circuit board with a multilayer structure can be prepared.

(Embodiment 5)

Figure 25:
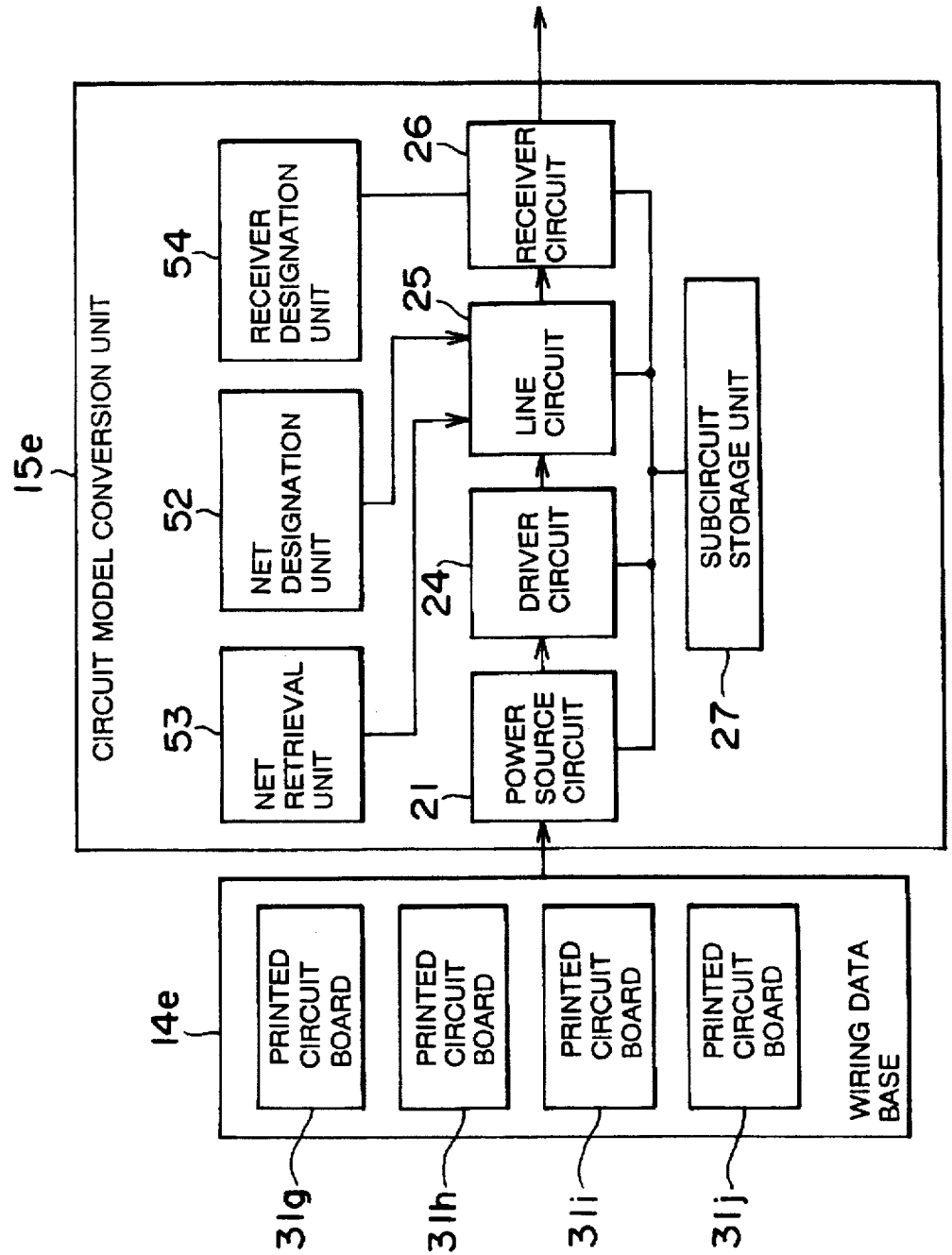
FIG. 25 is a diagram depicting the circuit model conversion unit of embodiment 5.

Next, the circuit model conversion unit of embodiment 5 is depicted in FIG. 25. The circuit model conversion unit 15e comprises a power source circuit 21, a driver circuit 24, a line circuit 25, a receiver circuit 26, and a subcircuit storage unit 27. The circuit model conversion unit 15e further comprises a net designation unit 52 connected to the line circuit 25, a net retrieval unit 53 connected to the line circuit 25, and a receiver designation unit 54 connected to the receiver circuit 26.

When a plurality of nets are available as wiring information, the net designation unit 52 designates the net to be used for executing circuit simulation from among the plurality of nets. When a net has been designated by the net designation unit 52, the net retrieval unit 53 retrieves a close net/orthogonal net that is close or orthogonal to the designated net.

When a plurality of receivers are available as wiring information, the receiver designation unit 54 designates the receiver to be used for executing circuit simulation from among the plurality of receivers.

When a receiver has been designated by the receiver designation unit 54, the net retrieval unit 53 retrieves a close net/orthogonal net that is close or orthogonal to the designated receiver.

A wiring data base 14e stores wiring information about the printed circuit boards 31g through 31j depicted in FIG. 26 through FIG. 29.

Figure 26:
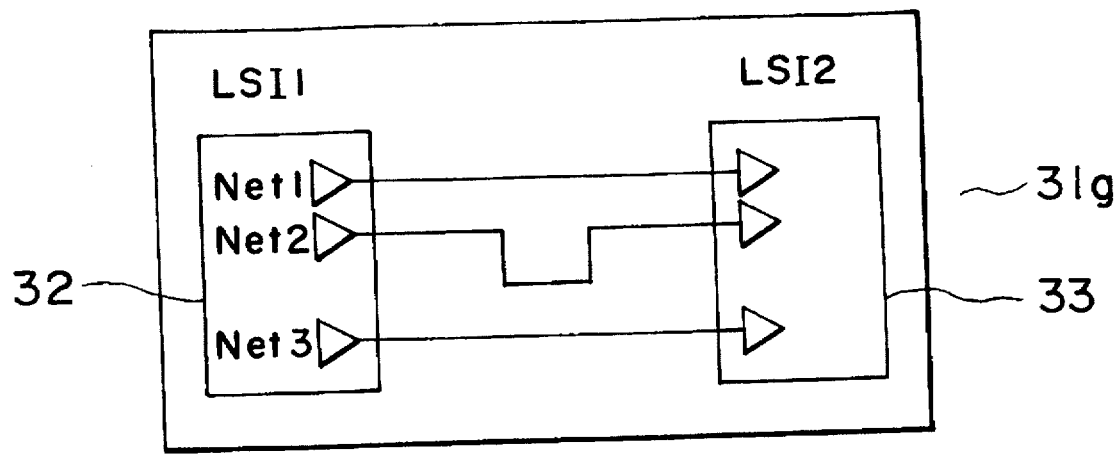
FIG. 26 is a diagram depicting a first example of the printed circuit board of embodiment 5.

First, the printed circuit board 31g depicted in FIG. 26 is used when not the noise but the electric delay time from a driver 32 to a receiver 33 is measured in a simple manner.

The net designation unit 52 designates the net whose delay time is sought by the user from among the nets N1 through N3 depicted in FIG. 26, and the line circuit 25 subjects only the designated net to circuit modeling and performs circuit simulation.

This allows the information sought by the user to be supplied in a short time.

Figure 27:
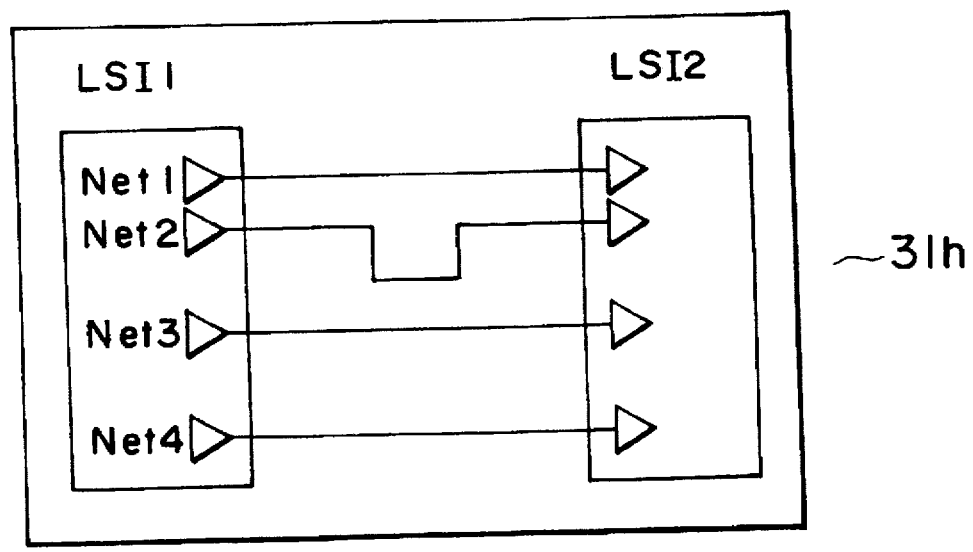
FIG. 27 is a diagram depicting a second example of the printed circuit board of embodiment 5.

Next, the printed circuit board 31h depicted in FIG. 27 is used when the user measures the noise only for a net that is close or orthogonal to a specific net.

The net retrieval unit 53 retrieves the nets N1 and N3 associated with the net N2 as close nets. The net N4 is not modeled in this case.

Figure 28:
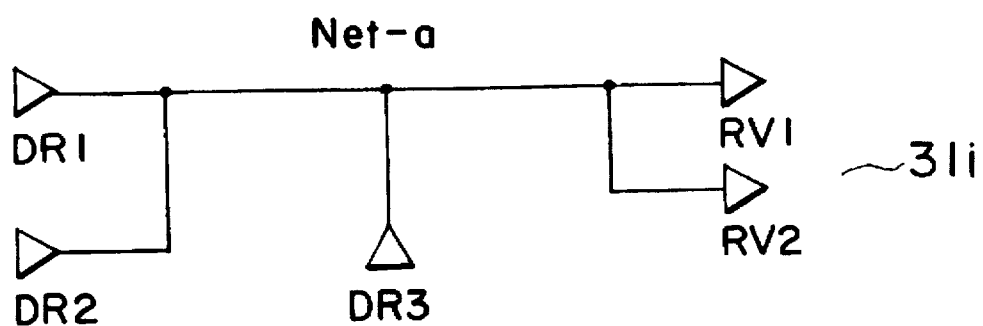
FIG. 28 is a diagram depicting a third example of the printed circuit board of embodiment 5.

Next, the printed circuit board 31i depicted in FIG. 28 is used when the Goal is to designate a net but the net name is not known, or when the goal is to measure the delay time for a specific receiver circuit. When a receiver circuit RV1 is designated, the receiver designation unit 54 designates the entire net a, and the entire net a is modeled.

Figure 29:
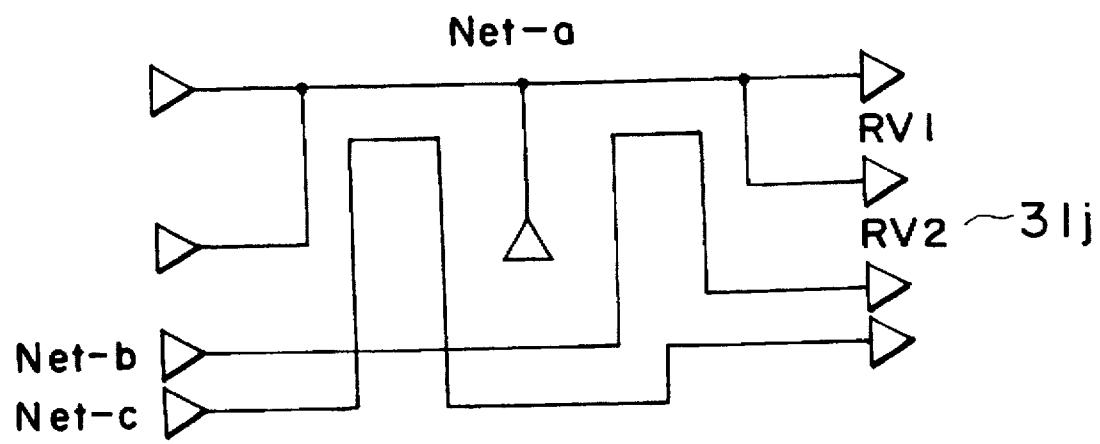
FIG. 29 is a diagram depicting a fourth example of the printed circuit board of embodiment 5.

Next, the printed circuit board 31j depicted in FIG. 29 is used when the goal is to designate the net but the net name is not known, or when the goal is to measure the noise for a specific receiver circuit.

The net retrieval unit 53 retrieves the net b and net c that are close to the designated receivers RV1 and RV2 connected to the net a. The net b and net c are modeled automatically, power is supplied to the net b and net c, and circuit simulation is executed. The noise received by the designated receivers RV1 and RV2 from the net a is measured.

As a result, rather than simulating the entire wiring, it is possible to measure the portions in which the noise is likely to be substantial based on the wiring conditions and experience.

(Embodiment 6)

Figure 30:
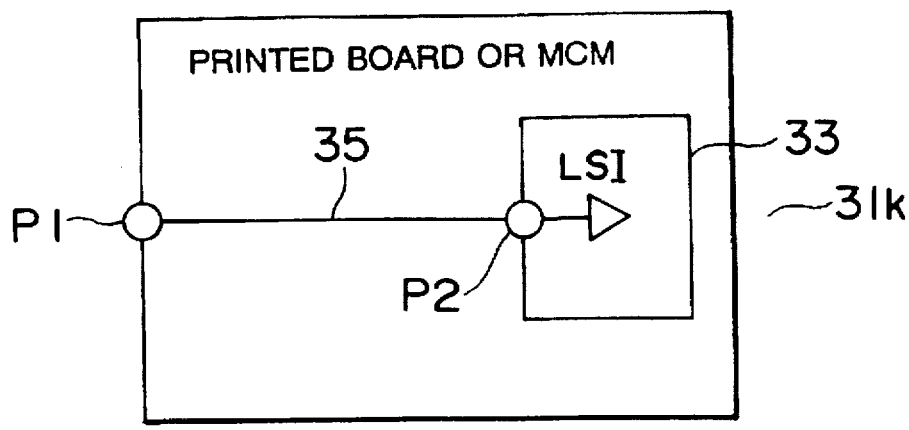
FIG. 30 is a diagram depicting the printed circuit board to be used for being converted by the circuit model conversion unit of embodiment 6.

Embodiment 6 of the circuit model conversion unit will now be described. The printed circuit board to be converted by the circuit model conversion unit is depicted in FIG. 30. As shown in FIG. 30, the printed circuit board 31k has an input pin P1 for inputting signals, a net 35, an output pin P2, and a receiver 33.

Figure 31:
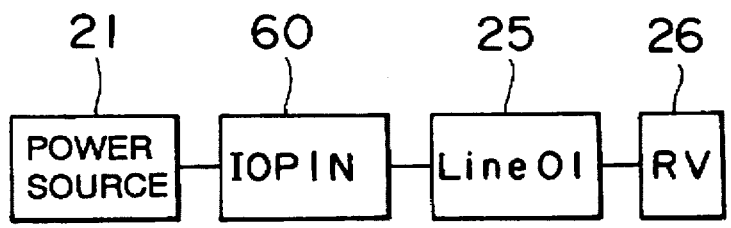
FIG. 31 is a diagram depicting a circuit model containing no resistance circuits.

When the circuit model conversion unit converts such wiring information into a circuit model, the circuit model comprises a power source circuit 21, an input/output pin (IOPIN) 60, a line circuit (Line 01) 25, and a receiver circuit (RV) 26, as shown in FIG. 31. Oscillation sometimes occurs when circuit simulation is executed using this circuit model.

Figure 32:
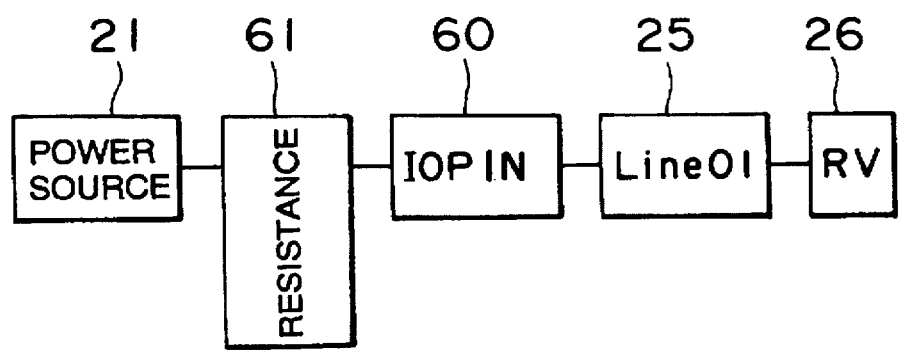
FIG. 32 is a diagram depicting a circuit model containing a resistance circuit.

In embodiment 6, therefore, a resistance circuit 61 is allocated between the power source circuit 21 and the input/output pin 60, as shown in FIG. 32.

This allows circuit simulation to be performed securely without signal oscillation.

(Embodiment 7)

Figure 33:
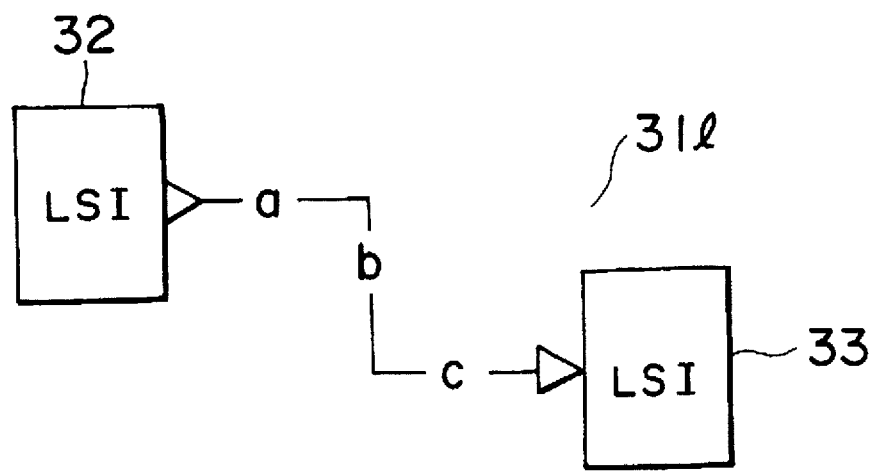
FIG. 33 is a diagram depicting the printed circuit board to be used for being converted by the circuit model conversion unit of embodiment 7.

Embodiment 7 of the circuit model conversion unit will now be described. The printed circuit board to be converted by the circuit model conversion unit is depicted in FIG. 33. As shown in FIG. 33, the printed circuit board 311 has a driver 32, a receiver 33, and a net composed of crank-shaped partial nets a through c.

Figure 34:
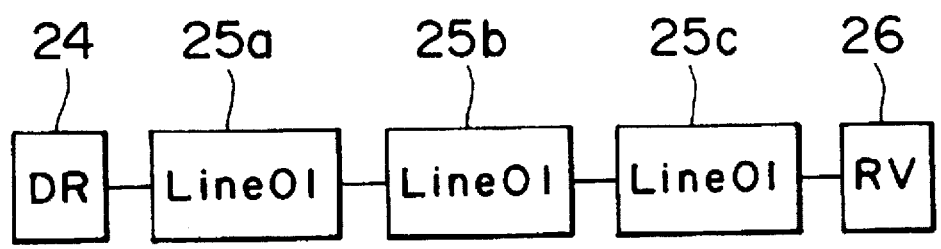
FIG. 34 is a diagram depicting a circuit model containing a plurality of identical line circuits.
Figure 35:
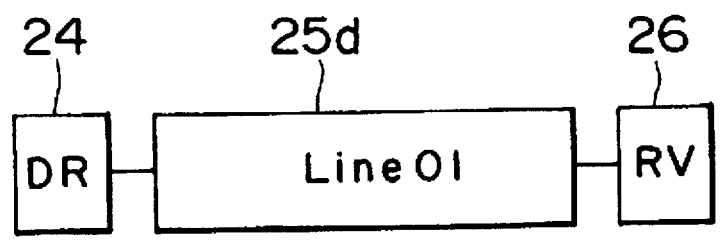
FIG. 35 is a diagram depicting a circuit model containing a compressed line circuit.

When the circuit model conversion unit converts such wiring information into a circuit model, the circuit model comprises a driver circuit 24, three line circuits 25a through 25c (Line 01) connected in series, and a receiver circuit (RV) 26, as shown in FIG. 34. Considerable time is needed when circuit simulation is executed using this circuit model.

This is the reason that in embodiment 7 the circuit model conversion unit converts the three line circuits 25a through 25c into a single compressed line circuit 25d. The length of the single compressed line circuit 25d is the length of the nets a through c.

The circuit is simplified by the use of the same circuit model when the same circuits form a continuous arrangement in such a manner. As a result of this, it does not take too much time to perform a simulation.

(Embodiment 8)

Embodiment 8 of the circuit model conversion unit will now be described. With conventional circuit simulation, substantial calculation time is required for analyzing the electro magnetic field in a cross section containing target signals when the inductance (L) and capacitance (C) of the target signals are formed.

In view of this, embodiment 8 involves reading the electrical parameters stored in a look-up table and automatically forming a circuit model in order to reduce the calculation time.

Figure 36:
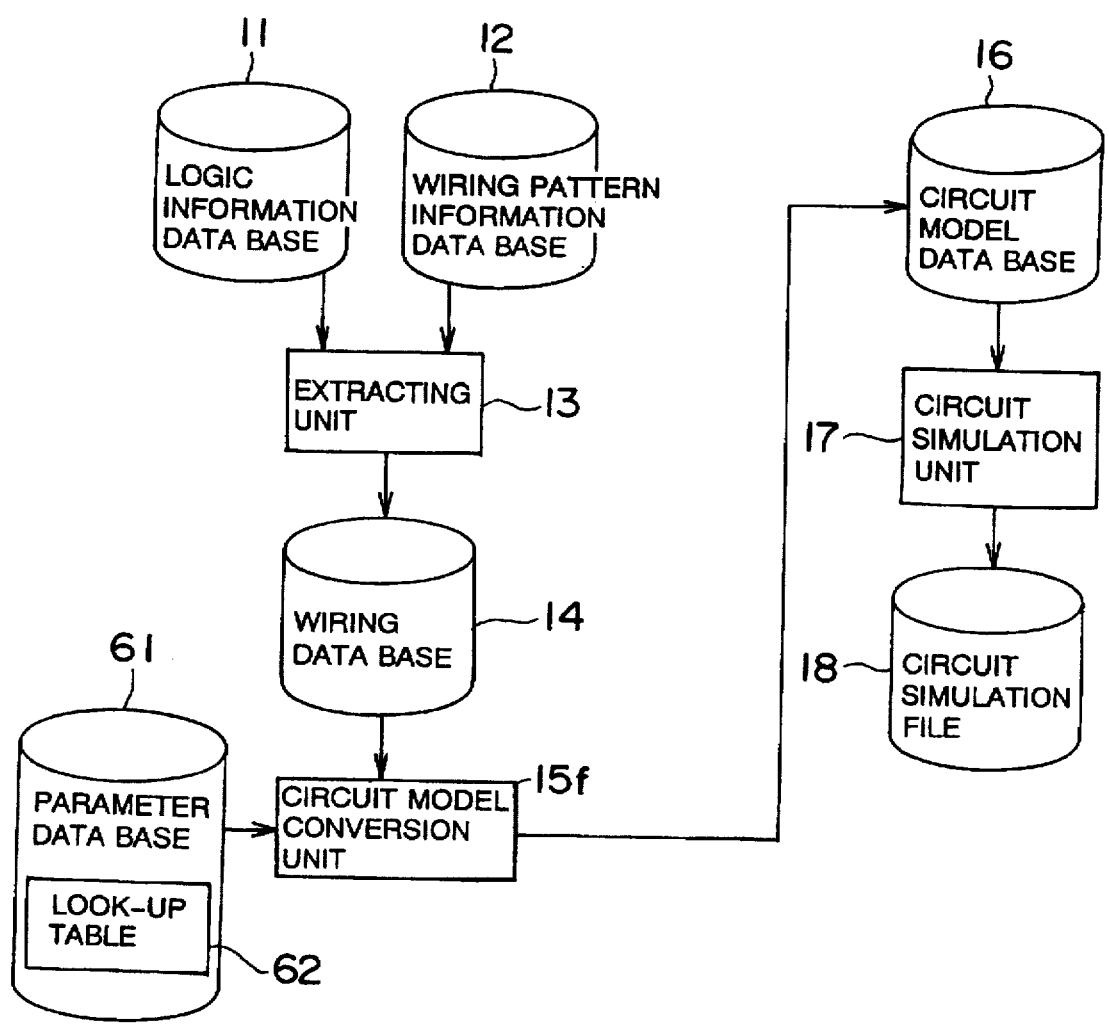
FIG. 36 is a diagram depicting a circuit simulation model extracting device according to embodiment 8 of the present invention.

A circuit simulation model extracting device in accordance with embodiment 8 of the present invention is depicted in FIG. 36. In FIG. 36, a parameter data base 61 is connected to a circuit model conversion unit 15f.

The parameter data base 61 stores the inductance (L), capacitance (C), and other electrical parameters corresponding to the wiring information stored in the wiring data base 14. The parameter data base 61 is provided with a look-up table 62 that stores the electrical parameters.

The circuit model conversion unit 15f reads the electrical parameters stored in the look-up table 62 and adds the electrical parameters to each circuit model.

Figure 37:
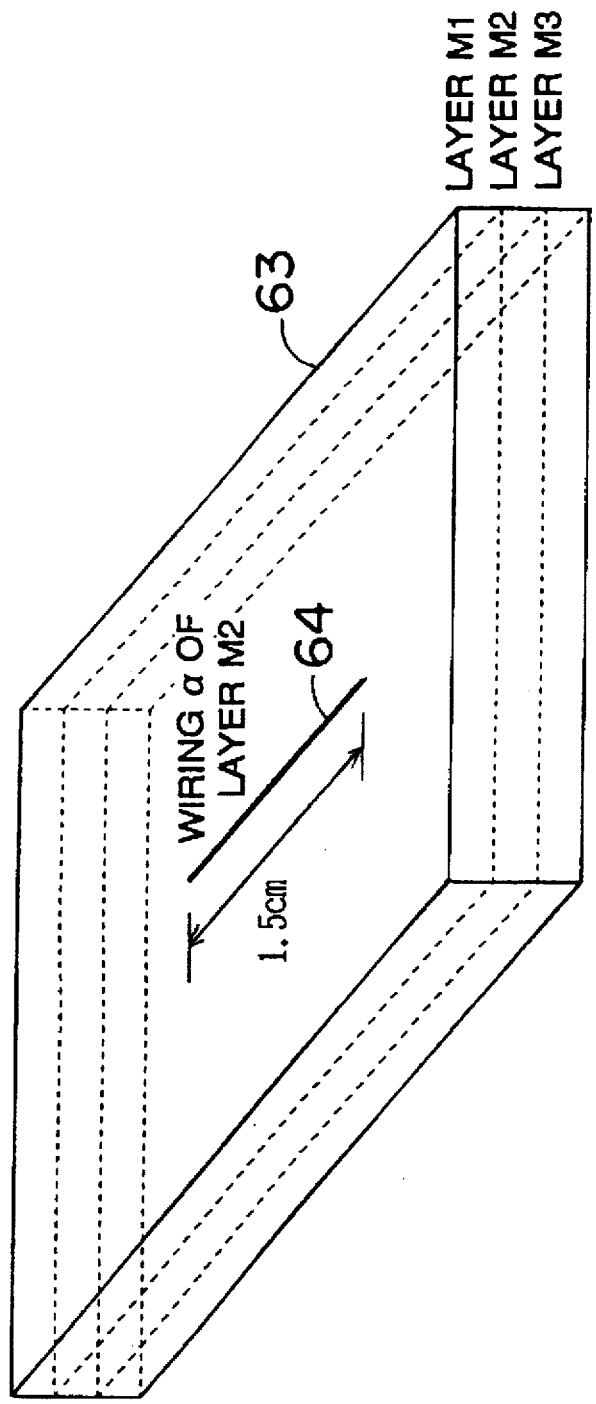
FIG. 37 is a diagram depicting a multilayer printed circuit board of embodiment 8.

An example of adding electrical parameters to a circuit model will now be described. The printed circuit board is a multilayer printed circuit board 63 composed of three layers M1 through M3, as shown in FIG. 37. A wiring 64 having a wiring length of 1.5 cm is positioned in the intermediate layer M2.

Figure 38:
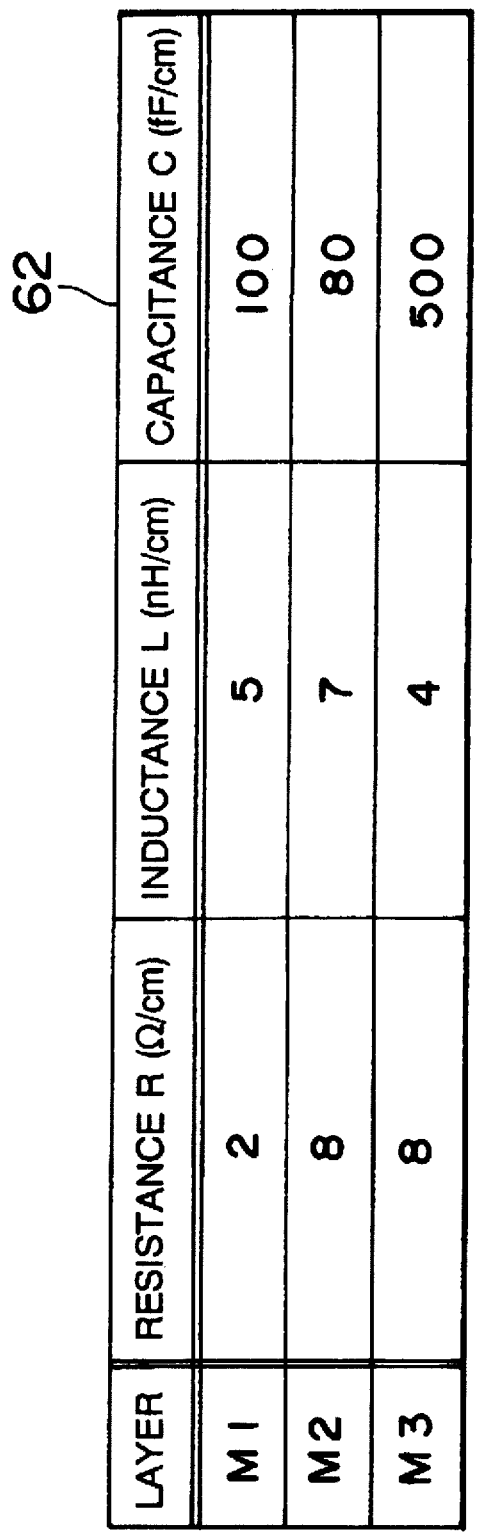
FIG. 38 is a diagram depicting the pattern of each layer in the look-up table.

In addition, as shown in FIG. 38, the look-up table 62 stores the resistance R, inductance L, and capacitance C parameters for each layer.

Because in the example depicted in FIG. 37 the wiring 64 is positioned in the intermediate layer M2, the circuit model conversion unit 15f reads the parameters for the M2 layer in the look-up table 62. In the parameters that have been read out, the resistance R is 8 ohm/cm, the inductance L is 7 nH/cm, and the capacitance C is 80 fF/cm.

Because the actual wiring is 1.5 cm, the resistance R is 1.5×8 ohm/cm, the inductance L is 1.5×7 nH/cm, and the capacitance C is 1.5×80 fF/cm.

Thus, the circuit model conversion unit 15f reads the numerical values required as subcircuit parameters for each circuit model, and the circuit simulation unit 17 performs circuit simulation using the parameters. It is therefore possible to perform accurate circuit simulation and to substantially reduce the calculation time.

In addition, stable circuit simulation accuracy can be obtained irrespective of the circuit shape because a look-up table is used.

(Embodiment 9)

Embodiment 9 of the circuit model conversion unit will now be described. With conventional circuit simulation, the electro magnetic field is difficult to analyze when there are junction vias in the multilayer printed circuit board.

Figure 39:
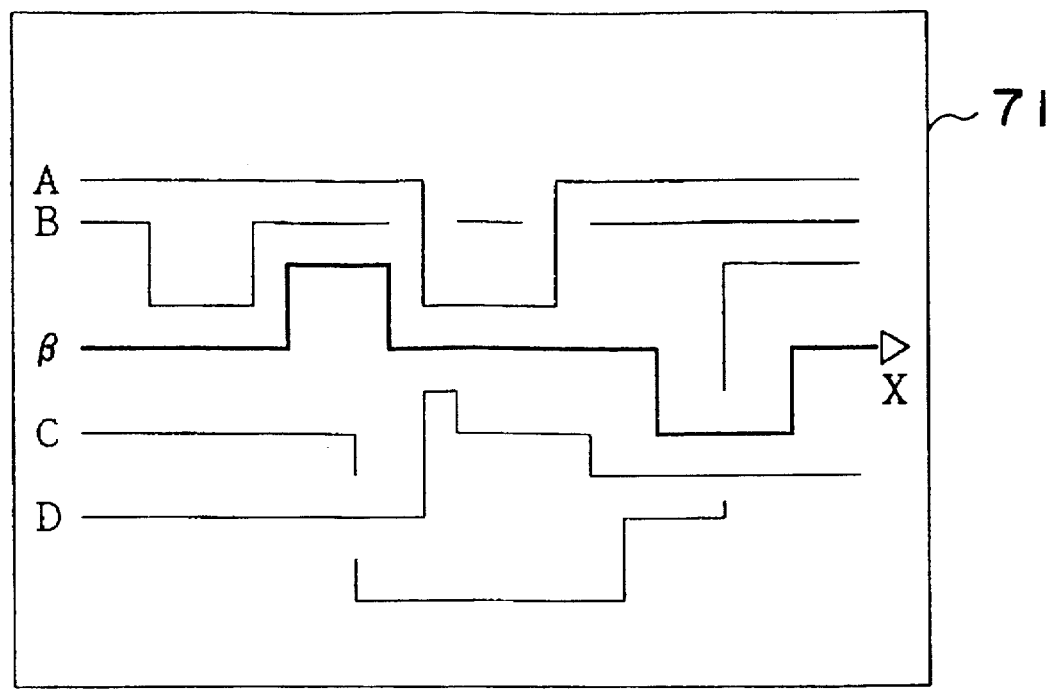
FIG. 39 is a diagram depicting an example of crosstalk noise measurement.

For example, when there is a plurality of wirings in a printed circuit board 71 such as that in FIG. 39 and noise is measured for a target wiring β by a simulation unit, the circuit model conversion unit performs complete modeling for the target wiring β and for wirings A, B, C, and D whose noise can affect the target wiring β.

A power source is therefore connected to each of the wirings A, B, C, and D, and the changes in voltage occurring in the receiver of the wiring β are measured.

With such circuit simulation processing, however, the time needed is proportional to the square of the number of wirings undergoing circuit modeling. In addition, the results of executing circuit simulation have poor accuracy.

With the foregoing in view, these drawbacks are overcome in Embodiment 9. A circuit simulation model extracting device in accordance with Embodiment 9 is depicted in FIG. 40.

Figure 40:
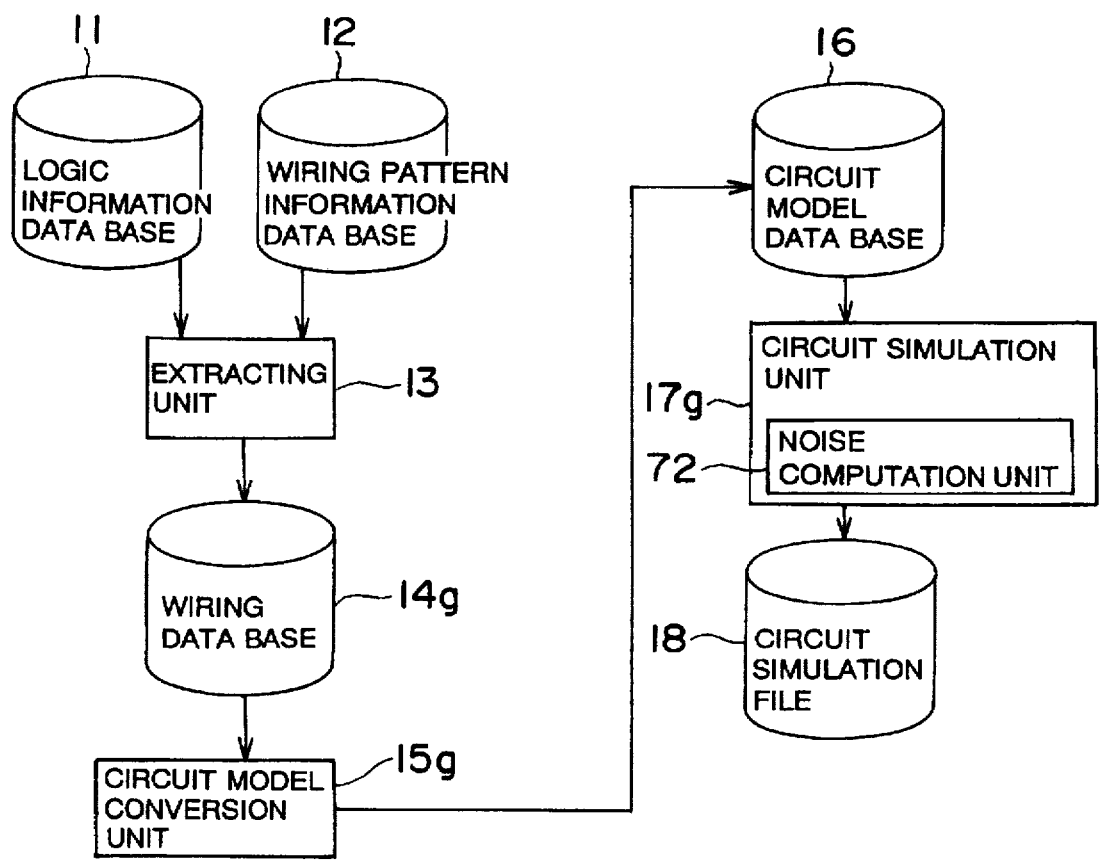
FIG. 40 is a diagram depicting a circuit simulation model extracting device in accordance with embodiment 9.

In FIG. 40, a wiring data base 14g stores as wiring information the four influence nets A, B, C, and D and the single target net β (target wiring β) of the printed circuit board 71 depicted in FIG. 39. The single target net β is a status of least one of close and orthogonal to the four influence nets A, B, C, and D.

A circuit model conversion unit 15g prepares separate circuit models expressing the relation between the single target net β and each influence net A, B, C, or D for each of the influence nets constituting the four influence nets A, B, C, and D.

The simulation unit 17g executes the circuit simulation based on the separate circuit model prepared by the circuit model conversion unit 15g for each influence net. The simulation unit 17g is provided with a noise computation unit 72 for computing the crosstalk noise which the single target net β receives from the influence nets A, B, C, and D by measuring individual instances of crosstalk noise and combining the individual instances of crosstalk noise measured for each of the influence nets.

The operation of Embodiment 9 thus configured will now be described. First, the circuit model conversion unit 15g reads the influence net A and target net β depicted in FIG. 41 from the wiring information about the printed circuit board 71 depicted in FIG. 39, and prepares a separate circuit model expressing the relation between the single target net β and the influence net A.

Similar to the example depicted in FIG. 9, this example involves preparing a separate circuit model MD1 that results from converting wiring information containing close nets. Specifically, close nets with a wiring length L91 are converted into a single line subcircuit, and the remaining nets exclusive of the close nets are converted into two line subcircuits. In addition, as shown in FIG. 9, the separate circuit model MD1 is prepared by the addition of a power source subcircuit, a driver subcircuit, and a receiver subcircuit.

Furthermore, the simulation unit 17g executes the circuit simulation based on the separate circuit model MD1 prepared, and the noise computation unit 72 measures a separate instance of crosstalk noise NS1 in a receiver X connected to the target net B.

The circuit model conversion unit 15g subsequently reads the influence net B and target net B depicted in FIG. 42 from the wiring information about the printed circuit board 71, and prepares a separate circuit model MD2 expressing the relation between the single target net b and the influence net B.

Figure 41:
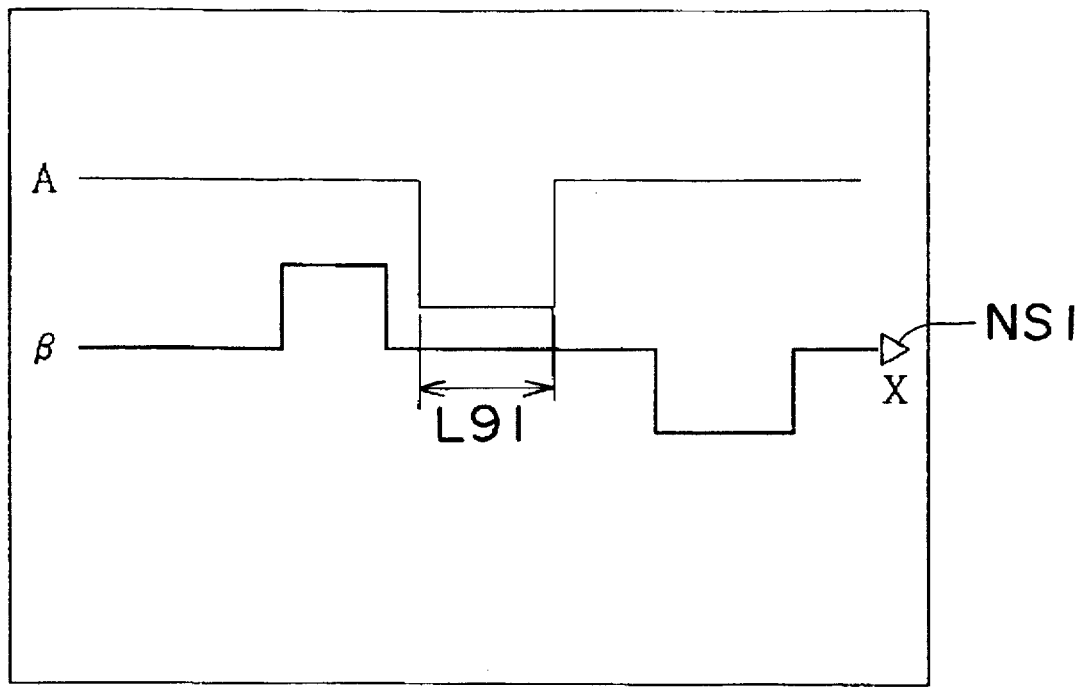
FIG. 41 is a diagram depicting an individual instance of crosstalk noise received by a target net from influence net A.

Specifically, similar to the example depicted in FIG. 41, close nets with wiring lengths L92 and L93 are converted into a single line subcircuit, and the remaining nets exclusive of the close nets are converted into two line subcircuits. In addition, a separate circuit model MD2 is prepared by the addition of a power source subcircuit, a driver subcircuit, and a receiver subcircuit.

Furthermore, the simulation unit 17g executes the circuit simulation based on the separate circuit model MD2 prepared, and the noise computation unit 72 measures a separate instance of crosstalk noise NS2 in the receiver X connected to the target net B.

Figure 43:
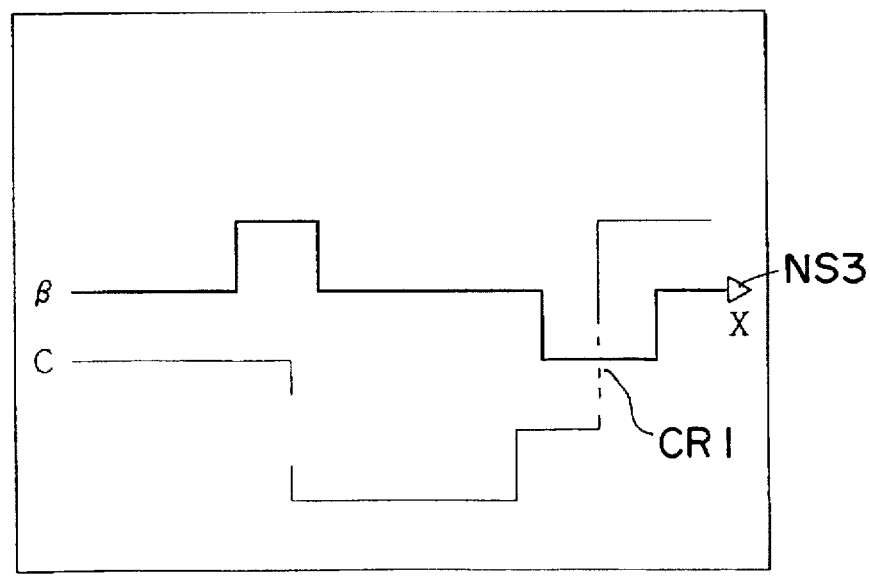
FIG. 43 is a diagram depicting an individual instance of crosstalk noise received by a target net from influence net C.

The circuit model conversion unit 15g subsequently reads the influence net C and target net B depicted in FIG. 43 from the wiring information about the printed circuit board 71, and prepares a separate circuit model MD3 expressing the relation between the single target net B and the influence net C.

Specifically, similar to the example depicted in FIG. 11, an orthogonal net CR1 is converted into a capacitive subcircuit, and the remaining nets exclusive of the orthogonal net are converted into a line subcircuit 2. In addition, a separate circuit model MD3 is prepared by the addition of a power source subcircuit, a driver subcircuit, and a receiver subcircuit.

Furthermore, the simulation unit 17g executes the circuit simulation based on the separate circuit model MD3 prepared, and the noise computation unit 72 measures a separate instance of crosstalk noise NS3 in the receiver X connected to the target net B.

Figure 44:
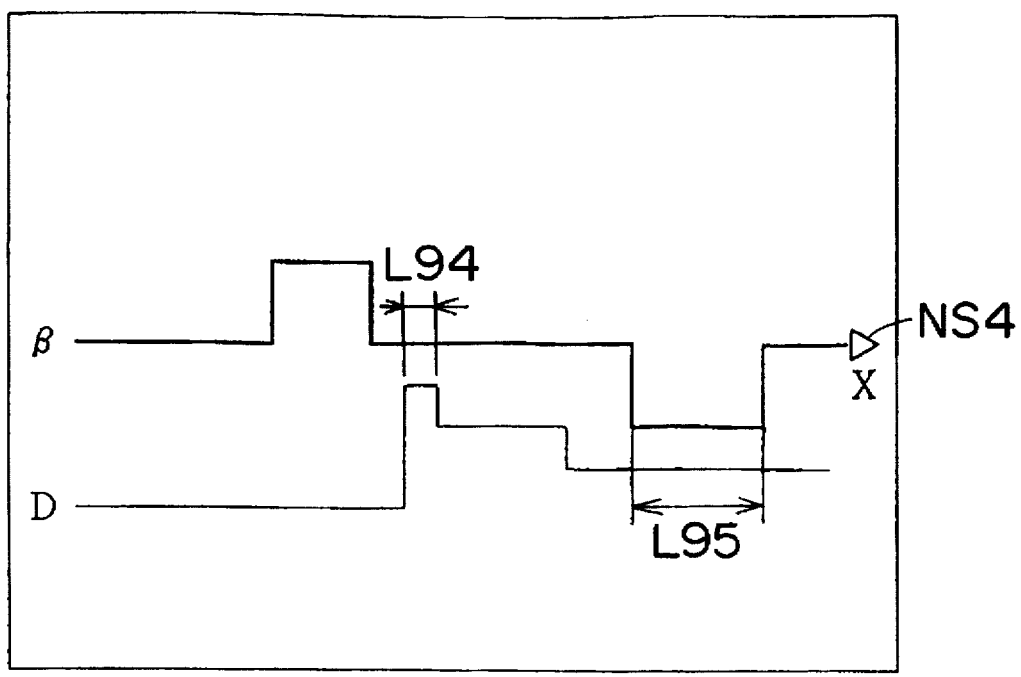
FIG. 44 is a diagram depicting an individual instance of crosstalk noise received by a target net from influence net D.

Finally, the circuit model conversion unit 15g reads the influence net D and target net b depicted in FIG. 44 from the wiring information about the printed circuit board 71, and prepares a separate circuit model MD4 expressing the relation between the single target net B and the influence net D.

Figure 42:
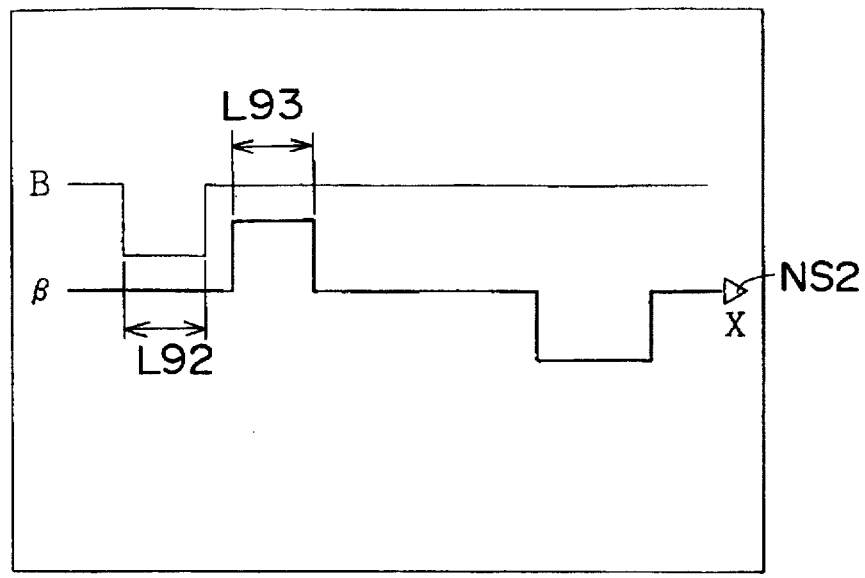
FIG. 42 is a diagram depicting an individual instance of crosstalk noise received by a target net from influence net B.

Specifically, similar to the example depicted in FIG. 42, close nets with wiring lengths L94 and L95 are converted into a single line subcircuit, and the remaining nets exclusive of the close nets are converted into two line subcircuits. In addition, a separate circuit model MD4 is prepared by the addition of a power source subcircuit, a driver subcircuit, and a receiver subcircuit.

Furthermore, the simulation unit 17g executes the circuit simulation based on the separate circuit model MD4 prepared, and the noise computation unit 72 measures a separate instance of crosstalk noise NS4 in a receiver X connected to the target net B.

The noise computation unit 72 then yields complete crosstalk noise by combining the separate instances of crosstalk noise NS1, NS2, NS3, and NS4 measured.

The complete crosstalk noise obtained is roughly equal to the crosstalk noise obtained by the conventional method.

Accurate noise can thus be measured because the target net noise measured for each influence net is synthesized. In addition, the processing time can be reduced because circuit simulation is executed for each influence net.

The present invention is not limited to the embodiments described above. For example, the circuit model conversion unit can determine the type of receiver circuit and adjust the voltage of the power source. This allows the driver circuit and the receiver circuit to be operated adequately and prevents their breakdown.

The circuit model conversion unit can also adjust the voltage of the power source on the basis of the positional relationship between the terminal resistance and the input/output pin of the printed circuit board. Signal oscillations sometimes occur when the input/output pin and the terminal resistance are placed close to each other, and the power source voltage is high. In such cases the signal oscillations can also be prevented by setting power source voltage to a comparatively low level.

What is claimed is:

1. A circuit simulation model extracting device, comprising:

a memory unit for storing logic information expressing a plurality of logic function elements constituting a logic circuit, and wiring information about a plurality of components that correspond to the plurality of logic function elements on a printed circuit board wherein the wiring information for a plurality of printed circuit boards includes a driver for performing driving based on signals from a power source, a receiver for receiving the signals, and a net for expressing a wiring that interconnects the driver and the receiver;

an extracting unit for extracting the wiring information and the logic information to be used for executing circuit simulation, from among the wiring information and logic information stored in said memory unit, the extracting unit extracting from among the wiring information for the plurality of printed circuit boards stored in the memory unit, the wiring information about the printed circuit boards that is to be used for executing the circuit simulation;

a circuit model conversion unit for converting the wiring information and the logic information extracted by said extracting unit into a circuit model suitable for executing the circuit simulation, the circuit model conversion unit comprising:

a subcircuit storage unit for storing as circuit simulation data, a power source subcircuit corresponding to the power source, a driver subcircuit corresponding to the driver, a receiver subcircuit corresponding to the receiver, and a line subcircuit corresponding to the net;

a power source circuit for reading the power source subcircuit from the subcircuit storage unit;

a driver circuit, connected to the power source subcircuit, for converting the driver into the driver subcircuit stored in the subcircuit storage unit;

a line circuit, connected to the driver subcircuit, for converting the net into the line subcircuit stored in the subcircuit storage unit; and a receiver circuit, connected to the line subcircuit, for converting the receiver into the receiver subcircuit stored in the subcircuit storage unit; and a simulation unit for executing the circuit simulation based on the circuit model converted by said circuit model conversion unit, and identifying an electrical characteristic between the plurality of components that corresponds to the wiring information and the logic information extracted by the extracting unit.

2. A circuit simulation model extracting device as defined in claim 1, wherein the extracting unit extracts a plurality of nets from the wiring information when the nets are contained in the wiring information; and the line circuit converts a plurality of parts of the nets into a single line, and remaining parts of the nets into a plurality of lines when the parts of the nets extracted by the extracting unit are close to each other.

3. A circuit simulation model extracting device as defined in claim 1, wherein the extracting unit extracts a plurality of nets from the wiring information when the nets are contained in the wiring information; and the line circuit converts a plurality of parts of the nets as capacitors, and remaining parts of the nets into a plurality of lines when the parts of the nets extracted by the extracting unit are orthogonal to each other.

4. A circuit simulation model extracting device as defined in claim 1, wherein the extracting unit extracts a plurality of nets from the wiring information when the nets are contained in the wiring information; and the circuit model conversion unit converts the wiring information into the subcircuits for each of the plurality of nets.

5. A circuit simulation model extracting device as defined in claim 2, wherein the circuit model conversion unit retrieves, for each net, a plurality of parts of the nets as close nets based on the wiring information.

6. A circuit simulation model extracting device as defined in claim 3, wherein the circuit model conversion unit retrieves, for each net, a plurality of parts of the nets as orthogonal nets based on the wiring information.

7. A circuit simulation model extracting device as defined in claim 1, wherein the circuit model conversion unit further comprises a net designation unit for designating the net to be used for executing the circuit simulation from among a plurality of nets when the nets are contained in the wiring information.

8. A circuit simulation model extracting device as defined in claim 1, further comprising:
a net retrieval unit for retrieving a close net that is close to a designated net when a net has been designated by the net designation unit.

9. A circuit simulation model extracting device as defined in claim 7, further comprising:
a net retrieval unit for retrieving an orthogonal net that is orthogonal to a designated net when a net has been designated by the net designation unit.

10. A circuit simulation model extracting device as defined in claim 1, wherein the circuit model conversion unit further comprises a receiver designation unit for designating the receiver to be used for executing the circuit simulation from among a plurality of receivers when the plurality of receivers are contained in the wiring information.

11. A circuit simulation model extracting device as defined in claim 10, further comprising:
a net retrieval unit for retrieving a close net that is close to a designated receiver when a receiver has been designated by the receiver designation unit.

12. A circuit simulation model extracting device as defined in claim 10, further comprising:
a net retrieval unit for retrieving an orthogonal net that is orthogonal to a designated receiver when a receiver has been designated by the receiver designation unit.

13. A circuit simulation model extracting device as defined in claim 1, wherein the circuit model conversion unit further comprises a direction conversion unit for converting a diagonal wiring into a wiring parallel to the horizontal direction in a cartesian coordinate system when the diagonal wiring is contained in the wiring information and the angle of the diagonal wiring with a prescribed line is equal to or less than a prescribed angle, and converting the diagonal wiring into a wiring parallel to the vertical direction when the angle exceeds the prescribed angle.

14. A circuit simulation model extracting device as defined in claim 1, wherein the line circuit converts a plurality of nets into the line subcircuit when the nets are contained in the wiring information and the distance between the nets is equal to or less than a prescribed distance, and converts none of the nets into the line subcircuit when the distance between the nets exceeds the prescribed distance.

15. A circuit simulation model extracting device as defined in claim 1, wherein the line circuit converts a plurality of parts of a plurality of nets into a line subcircuit when the plurality of nets are contained in the wiring information and the parts of the nets are close to each other and exceed a prescribed length, and converting none of the parts of the nets into a line subcircuit when the parts of the nets are equal to or less than the prescribed length.

16. A circuit simulation model extracting device as defined in claim 1, wherein the circuit model conversion unit further comprises an interlayer distance computation unit for computing a distance between the wiring of a self-layer and the wiring of another layer when the printed circuit board is a printed circuit board with a multilayer structure, and preparing a capacitive subcircuit according to the distance.

17. A circuit simulation model extracting device as defined in claim 1, wherein the circuit model conversion unit further comprises a junction-via processing unit for converting a junction via that connects the wiring of a self-layer with the wiring of another, adjacent layer into a capacitive subcircuit when the printed circuit board is a printed circuit board with a multilayer structure.

18. A circuit simulation model extracting device as defined in claim 1, wherein the circuit model conversion unit further comprises a compression circuit for compressing a first circuit and a second circuit connected to the first circuit into yet another single circuit when the first circuit, which is selected from among the power source circuit, the driver circuit, the line circuit, and the receiver circuit, is the same as the second circuit.

19. A circuit simulation model extracting device as defined in claim 1, wherein the circuit model conversion unit further comprises a resistance circuit for allocating a resistance subcircuit between the power source subcircuit and a pin subcircuit when a pin for inputting signals, the net connected to the pin, and the receiver connected to the net are contained in the wiring information.

20. A circuit simulation model extracting method, comprising:
a memory step for storing logic information expressing a plurality of logic function elements constituting a logic circuit, and wiring information about a plurality of components that correspond to the plurality of logic function elements on a printed circuit board, the wiring information for a plurality of printed circuit boards including a driver for performing driving based on signals from a power source, a receiver for receiving the signals, and a net for expressing wiring that interconnects the driver and the receiver;

an extracting step for extracting the wiring information and logic information to be used for executing circuit simulation from among the wiring information and logic information stored in the memory step, the extracting step extracting from among the wiring information for the plurality of printed circuit boards stored in the memory step, the wiring information about the printed circuit boards that is to be used for executing the circuit simulation;

a circuit model conversion step for converting the wiring information and logic information extracted by the extracting step into a circuit model suitable for executing the circuit simulation, the circuit model conversion step further comprising:
a subcircuit storage step for storing as circuit simulation data, a power source subcircuit corresponding to the power source, a driver subcircuit corresponding to the driver, a receiver subcircuit corresponding to the receiver, and a line subcircuit corresponding to the net;
a power source step for reading the power source subcircuit stored by a power source circuit in the subcircuit storage step;
a driver step for converting the driver by means of a driver circuit into the driver subcircuit stored in the subcircuit storage step;
a line step for converting the net by means of a line circuit into the line subcircuit stored in the subcircuit storage step; and
a receiver step for converting the receiver by means of a receiver circuit into the receiver subcircuit stored in the subcircuit storage step; and
a simulation step for executing the circuit simulation based on the circuit model converted in the circuit model conversion step, and identifying an electrical characteristic between the plurality of components that correspond to the wiring information and logic information extracted by the extracting step.

21. A circuit simulation model extracting method as defined in claim 20, wherein the extracting step extracts a plurality of nets from the wiring information when the nets are contained in the wiring information; and the line step converts a plurality of parts of the nets into a single line, and remaining parts of the nets into a plurality of lines when the parts of the nets extracted in the extracting step are close to each other.

22. A circuit simulation model extracting method as defined in claim 20, wherein the extracting step extracts a plurality of nets from the wiring information when the nets are contained in the wiring information; and the line step converts a plurality of parts of the nets as capacitors, and remaining parts of the nets into a plurality of lines when the parts of the nets extracted in the extracting step are orthogonal to each other.

23. A circuit simulation model extracting method as defined in claim 20, wherein the extracting step extracts a plurality of nets from the wiring information when the nets are contained in the wiring information, the circuit model conversion step converts the wiring information into the subcircuits for each of the plurality of nets.

24. A circuit simulation model extracting method as defined in claim 21, wherein the circuit model conversion step retrieves, for each net, a plurality of parts of the nets as close nets based on the wiring information.

25. A circuit simulation model extracting method as defined in claim 22, wherein the circuit model conversion step retrieves, for each net, a plurality of parts of the nets as orthogonal nets based on the wiring information.

26. A circuit simulation model extracting method as defined in claim 20, wherein the circuit model conversion step further comprises a net designation step for designating the net to be used for executing the circuit simulation from among a plurality of nets when the nets are contained in the wiring information.

27. A circuit simulation model extracting method as defined in claim 26, further comprising:

a net retrieval step for retrieving a close net that is close to a designated net when this net has been designated in the net designation step.

28. A circuit simulation model extracting method as defined in claim 26, further comprising:

a net retrieval step for retrieving an orthogonal net that is orthogonal to a designated net when a net has been designated in the net designation step.

29. A circuit simulation model extracting method as defined in claim 20, wherein the circuit model conversion step further comprises a receiver designation step for designating the receiver to be used for executing the circuit simulation from among a plurality of receivers when the plurality of receivers are contained in the wiring information.

30. A circuit simulation model extracting method as defined in claim 29, further comprising:

a net retrieval step for retrieving a close net that is close to a designated receiver when a receiver has been designated in the receiver designation step.

31. A circuit simulation model extracting method as defined in claim 29, further comprising:

a net retrieval step for retrieving an orthogonal net that is orthogonal to a designated receiver when a receiver has been designated in the receiver designation step.

32. A circuit simulation model extracting method as defined in claim 20, wherein the circuit model conversion step further comprises a direction conversion step for converting a diagonal wiring into a wiring parallel to the horizontal direction in a cartesian coordinate system when the diagonal wiring is contained in the wiring information and the angle of the diagonal wiring with a prescribed line is equal to or less than a prescribed angle, and converting the diagonal wiring into a wiring parallel to the vertical direction when the angle exceeds the prescribed angle.

33. A circuit simulation model extracting method as defined in claim 20, wherein the line step converts a plurality of nets into the line subcircuit when the nets are contained in the wiring information and the distance between the nets is equal to or less than a prescribed distance, and converts none of the nets into the line subcircuit when the distance between the nets exceeds the prescribed distance.

34. A circuit simulation model extracting method as defined in claim 20, wherein the line step converts a plurality of parts of a plurality of nets into a line subcircuit when the plurality of nets are contained in the wiring information and the parts of the nets are close to each other and exceed a prescribed length, and converting none of the parts of the nets into a line subcircuit when the parts of the nets are equal to or less than the prescribed length.

35. A circuit simulation model extracting method as defined in claim 20, wherein the circuit model conversion step further comprises an interlayer distance computation step for computing the distance between the wiring of a self-layer and the wiring of another layer when the printed circuit board is a printed circuit board with a multilayer structure, and preparing a capacitive subcircuit according to the distance.

36. A circuit simulation model extracting method as defined in claim 20, wherein the circuit model conversion step further comprises a junction-via processing step for converting a junction via that connects the wiring of a self-layer with the wiring of another, adjacent layer into a capacitive subcircuit when the printed circuit board is a printed circuit board with a multilayer structure.

37. A circuit simulation model extracting method as defined in claim 20, wherein the circuit model conversion step further comprises a compression step for compressing a first circuit and a second circuit connected to the first circuit into yet another single circuit when the first circuit, which is selected from among the power source circuit, the driver circuit, the line circuit, and the receiver circuit, is the same as the second circuit.

38. A circuit simulation model extracting method as defined in claim 20, wherein the circuit model conversion step further comprises a resistance generation step for allocating a resistance subcircuit between the power source subcircuit and a pin subcircuit when a pin for inputting signals, the net connected to the pin, and the receiver connected to the net are contained in the wiring information.

39. A circuit simulation model extracting device as defined in claim 1, comprising:

a look-up table for storing electrical parameters corresponding to pieces of wiring information for the plurality of printed circuit boards, and the circuit model conversion unit for reading, from the look-up table, electrical parameters corresponding to the wiring information about printed circuit boards to be used for executing the circuit simulation, and adding the electrical parameters to the wiring information.

40. A circuit simulation model extracting device as defined in claim 1, wherein the circuit model conversion unit prepares a separate circuit model expressing the relation between a single target net and each influence net of one or more influence nets for each of the one or more influence nets when the single target net and the one or more influence nets are contained in the wiring information, and the single target net is a status of least one of close and orthogonal to the one or more influence nets; and the simulation unit executes the circuit simulation based on the separate circuit models prepared by the circuit model conversion unit for each the influence net, measures individual instances of a crosstalk noise, and combines the individual instances of crosstalk noise measured for each of the influence nets, computes the crosstalk noise which the single target net receives from the one or more influence nets.

41. A circuit simulation model extracting method as defined in claim 20, comprising:

a preparation step for preparing a look-up table for storing electrical parameters corresponding to pieces of wiring information for the plurality of printed circuit boards; and the circuit model conversion step for reading, from the look-up table prepared in the preparation step, electrical parameters corresponding to the wiring information about printed circuit boards to be used for executing the circuit simulation, and adding the electrical parameters to the wiring information.

42. A circuit simulation model extracting method as defined in claim 20, wherein the circuit model conversion step prepares a separate circuit model expressing the relation between a single target net and each influence net of one or more influence nets for each of the one or more influence nets when the single target net and the one or more influence nets are contained in the wiring information, and the single target net is a status of least one of close and orthogonal to the one or more influence nets; and the simulation step executes the circuit simulation based on the separate circuit models prepared in the circuit model conversion step for each the influence net, measures individual instances of a crosstalk noise, and combines the individual instances of crosstalk noise measured for each of the influence nets, computes the crosstalk noise which the single target net receives from the one or more influence nets.

43. A method of preparing a logic circuit model for a logic circuit to be designed and simulated by computer, comprising:

constructing a first circuit model of said logic circuit by obtaining logic information for the logic circuit having a plurality of logic elements;

obtaining wiring information from the logic circuit corresponding to logic elements placed on one or more printed circuit boards, the wiring information being modeled by logic elements, including a driver for performing driving based on signals from a power source, a receiver for receiving the signals, and a net for wiring that interconnects the driver and receiver;

combining the logic information and the wiring information to form a first circuit model;

forming a second circuit model by converting the wiring information into a form including electrical characteristics, including converting the driver into a driver subcircuit, the net into a line subcircuit, and the receiver into a receiver subcircuit, the driver, time and receiver subcircuit, and the receiver into a receiver subcircuit, such subcircuits identifying electrical characteristics in the second circuit model;

simulating the second circuit model to determine circuit performance based on the electrical characteristics.

* * * * *

UNITED STATES PATENT AND TRADEMARK OFFICE
CERTIFICATE OF CORRECTION

PATENT NO. : 5,706,477
DATED : January 6, 1998
INVENTOR(S) : Kazunari GOTO

It is certified that error appears in the above-identified patent and that said Letters Patent is hereby corrected as shown below:

Cover Page, Item [30], line 2, change "7-027440" to --7-274440--.
Col. 23, line 10, change "claim 1" to --claim 7--.

Signed and Sealed this

Fourteenth Day of April, 1998

*Attest:*

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO. : 5,706,477
DATED : January 6, 1998
INVENTOR(S) : Kazunari GOTO

It is certified that error appears in the above-indentified patent and that said Letters Patent is hereby corrected as shown below:

Cover Page, Item [30], line 1, change "Nov. 5, 1994" to --Nov. 15, 1994--.

Signed and Sealed this

Sixteenth Day of June, 1998

*Attest:*

BRUCE LEHMAN

*Attesting Officer*  *Commissioner of Patents and Trademarks*